(12) United States Patent
Meng et al.

(10) Patent No.: US 12,341,170 B2
(45) Date of Patent: Jun. 24, 2025

(54) ENERGY STORAGE SYSTEM

(71) Applicant: Huawei Digital Power Technologies Co., Ltd., Shenzhen (CN)

(72) Inventors: Hao Meng, Dongguan (CN); Jun Chen, Dongguan (CN); Hengqu Li, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 383 days.

(21) Appl. No.: 17/952,455

(22) Filed: Sep. 26, 2022

(65) Prior Publication Data

US 2023/0095593 A1 Mar. 30, 2023

(30) Foreign Application Priority Data

Sep. 26, 2021 (CN) .......................... 202122340830.7

(51) Int. Cl.
*H01M 10/613* (2014.01)
*H01M 10/627* (2014.01)
(Continued)

(52) U.S. Cl.
CPC ....... *H01M 10/613* (2015.04); *H01M 10/627* (2015.04); *H01M 10/6563* (2015.04); *H01M 10/6566* (2015.04); *H01M 10/663* (2015.04); *H01M 50/204* (2021.01); *H01M 50/291* (2021.01); *H02J 7/0013* (2013.01); *H02J 7/0042* (2013.01); *H05K 5/0217* (2013.01); *H05K 7/20145* (2013.01); *H01M 2220/10* (2013.01); *H02J 2207/20* (2020.01)

(58) Field of Classification Search
CPC ............ H01M 10/613; H01M 10/627; H01M 10/6563; H01M 10/6556; H01M 10/6566; H01M 10/663; H01M 10/6568; H01M 50/204; H01M 2220/10; H05K 5/0217; H05K 7/20145
See application file for complete search history.

(56) References Cited

U.S. PATENT DOCUMENTS 10,522,801 B2 * 12/2019 Kronke ............... H01M 10/647
10,911,997 B2 * 2/2021 Lin ................... H04W 36/0088
(Continued)

FOREIGN PATENT DOCUMENTS

CN 212062489 U 12/2020
EP 4125148 A2 2/2023
(Continued)

*Primary Examiner* — Adam B Dravininkas
(74) *Attorney, Agent, or Firm* — Maier & Maier, PLLC

(57) ABSTRACT

An energy storage system includes a cabinet, an air conditioner, a battery energy storage unit, and an air duct. The air conditioner is fastened to the cabinet. The air conditioner includes an air supply vent and an air return vent. The battery energy storage unit is accommodated in the cabinet. A first channel and a second channel that are separated are formed between the battery energy storage unit and an inner wall of the cabinet. The second channel is connected to the air return vent. The battery energy storage unit includes an air intake vent and an air exhaust vent. The air intake vent is connected to the first channel. The air exhaust vent is connected to the second channel. The air duct is accommodated in the second passage.

19 Claims, 15 Drawing Sheets

(51) Int. Cl.
*H01M 10/6563* (2014.01)
*H01M 10/6566* (2014.01)
*H01M 10/663* (2014.01)
*H01M 50/204* (2021.01)
*H01M 50/291* (2021.01)
*H02J 7/00* (2006.01)
*H05K 5/02* (2006.01)
*H05K 7/20* (2006.01)

(56) References Cited

U.S. PATENT DOCUMENTS

| | | | | |
|---|---|---|---|---|
| 2012/0160448 A1* | 6/2012 | Chen | .................. | H05K 7/20754 |
| | | | | 165/67 |
| 2016/0105994 A1* | 4/2016 | Hwang | .............. | H05K 7/20745 |
| | | | | 361/695 |
| 2018/0226703 A1* | 8/2018 | Inoue | ................ | H01M 10/6565 |
| 2020/0281099 A1* | 9/2020 | Klaba | ................ | H05K 7/20309 |
| 2021/0329819 A1* | 10/2021 | Xu | .................... | H01M 10/6563 |

FOREIGN PATENT DOCUMENTS

| | | | |
|---|---|---|---|
| JP | 2018129181 A | 8/2018 | |
| WO | 2017044830 A1 | 3/2017 | |
| WO | 2018128783 A1 | 7/2018 | |

\* cited by examiner

ENERGY STORAGE SYSTEM

CROSS-REFERENCE TO RELATED APPLICATION

This application claims priority to Chinese Patent Application No. 202122340830.7, filed on Sep. 26, 2021, which is hereby incorporated by reference in its entirety.

TECHNICAL FIELD

The embodiments relate to the field of energy storage technologies, and an energy storage system.

BACKGROUND

Featuring application flexibility, high reliability, high energy density, and the like, battery energy storage attracts more attention. To prolong a service life of a battery, a working temperature of the battery needs to be controlled. In a temperature control solution of a battery energy storage system, two columns of air conditioners are built on a cabinet door to control a temperature of components in a cabinet in the energy storage system. However, in the temperature control solution, an air supply channel of the air conditioner and an air return channel of the air conditioner are connected to each other, causing a relatively large loss of an airflow (for example, a cold airflow) blown out from the air conditioner and affecting temperature control efficiency of the energy storage system. Therefore, working reliability of the energy storage system is affected.

BACKGROUND The embodiments provide an energy storage system to improve working reliability.

According to a first aspect, the embodiments may provide an energy storage system, including a cabinet, an air conditioner, a battery energy storage unit, and an air duct. The air conditioner is fastened to the cabinet, and the air conditioner includes an air supply vent and an air return vent. The battery energy storage unit is accommodated in the cabinet. A first channel and a second channel that are separated are formed between the battery energy storage unit and an inner wall of the cabinet. The second channel is connected to the air return vent. The battery energy storage unit includes an air intake vent and an air exhaust vent, the air intake vent is connected to the first channel, and the air exhaust vent is connected to the second channel. The air duct is accommodated in the second channel, and the air duct is connected to the air supply vent and the first channel, and is configured to guide, to the first channel, an airflow blown out from the air supply vent.

For example, the airflow blown out from the air supply vent of the air conditioner is cold air. The cold air blown out from the air supply vent of the air conditioner directly enters the first channel through the air duct, and then enters the inside of the battery energy storage unit from the air intake vent for cooling and heat dissipation to form hot air. The hot air flows out from the air exhaust vent, enters the second channel, and then returns to the air return vent of the air conditioner to implement circulation. The first channel is an air supply channel used for the airflow blown out from the air supply vent of the air conditioner to enter the battery energy storage unit, and the second channel is an air return channel used for the airflow flowing out of the battery energy storage unit to return to the air conditioner. When the airflow blown out from the air supply vent of the air conditioner is cold air, the first channel may be considered as a cold channel, and the second channel may be considered as a hot channel.

It may be understood that the airflow blown out from the air supply vent of the air conditioner may be alternatively hot air. For example, when the energy storage system works under a cold condition (for example, a temperature of an environment in which the energy storage system is located is not greater than 15 degrees below zero), the first channel may be considered as a hot channel, and the second channel may be considered as a cold channel.

Because the first channel and the second channel are separated, cold and hot separation between an air supply channel and an air return channel of the air conditioner in the energy storage system is implemented, to reduce a loss of a cold airflow or a hot airflow blown out from the air supply vent of the air conditioner and improve temperature control (including heat dissipation or heating) efficiency of the energy storage system, thereby improving working reliability of the energy storage system.

In a first possible implementation of the first aspect, the battery energy storage unit includes a mounting component and at least two columns of battery modules mounted above the mounting component in a first direction, the air duct is fastened to the mounting component, the battery module includes a first air intake surface and an air exhaust surface that are disposed opposite to each other in a second direction, the air exhaust surface is located on a side that is of the battery module and that faces the second channel, the air intake vent is disposed on the first air intake surface, the air exhaust vent is disposed on the air exhaust surface, and the first direction is different from the second direction.

The first channel extends to a side that is of the battery module and that is away from the air conditioner, so that air enters the battery module from the side that is of the battery module and that is away from the air conditioner, and air is exhausted from the battery module from a side that is of the battery module and that faces the air conditioner, thereby increasing a contact surface between the battery module and the airflow and improving temperature control efficiency of the air conditioner on the battery module.

In a second possible implementation of the first aspect, the mounting component includes a plurality of mounting racks and an air guide plate, the plurality of mounting racks is arranged in the first direction, one column of support positions is formed between every two adjacent mounting racks, and each battery module is disposed on one support position. The air guide plate is fastened on a side that is of the mounting rack and that faces the air conditioner and is in sealed contact with the inner wall of the cabinet, so that a side that is of the battery energy storage unit and that faces the air conditioner and the cabinet form the second channel, and a remaining part of the battery energy storage unit and the inner wall of the cabinet form the first channel. The air guide plate includes a connection port, the air duct is fastened to the air guide plate, and the air duct is connected to the first channel by using the connection port.

The air guide plate is disposed to effectively prevent an airflow from entering the inside of the battery energy storage unit from the side that is of the battery energy storage unit and that faces the air conditioner, so that the airflow is "forced" to enter the first channel, and the airflow blown out from the air supply vent of the air conditioner can reach a side that is of the battery energy storage unit and that is away from the air conditioner.

In a third possible implementation of the first aspect, the air guide plate includes a first air guide plate and a second air guide plate. The first air guide plate is fastened on a side that is of a mounting rack at the end in the first direction and that faces the air conditioner and is in sealed contact with the inner wall of the cabinet, and the first air guide plate extends in a third direction. The connection port is disposed on the first air guide plate, and the air duct is fastened to the first air guide plate. The second air guide plate is fastened on a side that is of the mounting rack and that faces the air conditioner and is in sealed contact with the inner wall of the cabinet, the second air guide plate extends in the second direction, the third direction is different from the first direction, and the third direction is different from the second direction.

The first air guide plate is fastened on the side that is of the mounting rack at the end in the first direction and that faces the air conditioner, and is in sealed contact with the inner wall of the cabinet, and the connection port connected to the air duct is disposed on the first air guide plate, to supply air from a side of the battery energy storage unit, thereby increasing a contact area between the battery module and the airflow blown out from the air supply vent of the air conditioner and improving temperature control efficiency of the energy storage system.

In a fourth possible implementation of the first aspect, a gap is formed between every two adjacent battery modules in a same column of battery modules, the air guide plate further includes a plurality of third air guide plates extending in the second direction, and each third air guide plate is fastened to sides that are of two adjacent mounting racks and that face the air conditioner to cover a corresponding gap formed between every two adjacent battery modules in a same column of battery modules, to separate the first channel from the second channel.

In a fifth possible implementation of the first aspect, the mounting rack includes a support and at least one guide rail fastened to the support, each battery module is slidably connected to a corresponding guide rail in the second direction, a guide rail is sandwiched between every two adjacent battery modules in the third direction, so that a gap is formed between every two adjacent battery modules in the third direction, and the air guide plate is fastened to the support and/or the guide rail.

When the battery module needs to be assembled onto the mounting component, the battery module is directly pushed into the support position of the mounting component along the guide rail, to facilitate assembly between the battery module and the mounting component. When the battery module needs to be removed from the mounting component, the battery module is directly pulled and removed along the guide rail, to facilitate removal of the battery module from the mounting component.

In a sixth possible implementation of the first aspect, the air guide plate further includes a fourth air guide plate fastened to and covering a support of the mounting rack at the end in the first direction.

In a seventh possible implementation of the first aspect, the support includes a first support post and a second support post that are spaced apart in the second direction, the guide rail is fastened between the first support post and the second support post, the first support post is disposed on a side that is of the support and that is close to the air conditioner, the second support post is fastened to the cabinet, and the second support post and the first air intake surface are spaced apart.

The first air intake surface and the second support post of the mounting rack are not aligned with each other. A gap exists between every two adjacent battery modules in the first direction because of the mounting rack, and an airflow flowing in the first channel can enter the inside of the battery energy storage unit from a gap between adjacent battery modules in the first direction, so that the airflow enters the battery module from a side of the battery module.

In an eighth possible implementation of the first aspect, the battery module further includes a second air intake surface and a third air intake surface, the second air intake surface and the third air intake surface are disposed opposite to each other in the first direction, and air intake vents are disposed on both the second air intake surface and the third air intake surface. For every two adjacent battery modules in the first direction, a second air intake surface of one battery module and a third air intake surface of the other battery module are disposed opposite to each other and a gap is formed.

The airflow flowing in the first channel can enter the inside of the battery energy storage unit from a gap between adjacent battery modules, and then enter the inside of the battery module from the second air intake surface and the third air intake surface for flowing, to implement air intake from a side of the battery module.

In a ninth possible implementation of the first aspect, the battery module further includes a fourth air intake surface and a fifth air intake surface, the fourth air intake surface and the fifth air intake surface are disposed opposite each other in the third direction, air intake vents are disposed on both the fourth air intake surface and the fifth air intake surface, the third direction is different from the first direction, and the third direction is different from the second direction. For every two adjacent battery modules in the third direction, a fourth air intake surface of one battery module and a fifth air intake surface of the other battery module are disposed opposite to each other and a gap is formed.

The airflow in the first channel enters the inside of the battery module from the fourth air intake surface and the fifth air intake surface, to implement air intake from an upper side/a lower side of the battery module. The battery module may have a multi-sided air intake to improve a temperature control effect of the energy storage system.

In a tenth possible implementation of the first aspect, the battery module further includes a mounting ear disposed on the air exhaust surface, and the mounting ear is fastened to a corresponding mounting rack to improve connection stability between the battery module and the mounting component.

In an eleventh possible implementation of the first aspect, the cabinet includes a body and two cabinet doors, the cabinet doors are rotatably connected to the body, the two cabinet doors are arranged in the first direction, at least one column of air conditioners in a third direction is disposed on each cabinet door, each column of air conditioners corresponds to at least one column of battery modules, an inner wall of the body and the battery energy storage unit form the first channel, an inner wall of the cabinet door and the battery energy storage unit form the second channel, the third direction is different from the first direction, and the third direction is different from the second direction. At least one column of air conditioners is built on each cabinet door to improve temperature control efficiency of the energy storage system.

In a twelfth possible implementation of the first aspect, the body includes two side plates, a rear plate, a top plate, and a bottom plate, each side plate is correspondingly rotatably connected to one cabinet door, the rear plate is fastened to the two side plates, the rear plate and the cabinet door are disposed opposite to each other in the second direction, the top plate is fastened to the two side plates, the bottom plate is fastened to the two side plates, all of the side plate, the rear plate, the top plate, and the bottom plate are in sealed contact with the battery energy storage unit, and the side plate, the rear plate, the top plate, the bottom plate, and the battery energy storage unit jointly form the first channel. In this way, the first channel is disposed around the battery energy storage unit, so that a contact surface between the battery energy storage unit and the airflow blown out from the air conditioner is increased, and temperature control efficiency of the energy storage system is improved.

In a thirteenth possible implementation of the first aspect, there are at least two air conditioners, the at least two air conditioners are arranged in two columns in the first direction, and each column of air conditioners corresponds to at least one column of battery modules. The battery module includes a housing, a battery body, and a module fan, and the battery body and the module fan are fastened and accommodated in the housing. When an abnormal air conditioner column exists in the two columns of air conditioners, a rotational speed of a module fan of a battery module corresponding to the abnormal air conditioner column increases, to increase a flow velocity of an airflow in the battery module corresponding to the abnormal air conditioner column and improve temperature evenness of the energy storage system.

In a fourteenth possible implementation of the first aspect, there are at least two air conditioners, the at least two air conditioners are arranged into a first air conditioner column and a second air conditioner column in the first direction, and each of the first air conditioner column and the second air conditioner column corresponds to at least one column of battery modules. The energy storage system further includes a drainage fan fastened and accommodated in the first channel, and an air exhaust surface of the drainage fan faces a side on which a battery module corresponding to an abnormal air conditioner column in the first air conditioner column and the second air conditioner column is located.

In this way, the airflow in the first channel can be guided from a position of a battery module corresponding to a non-abnormal air conditioner column to a position of the battery module corresponding to the abnormal air conditioner column, so that temperature control can also be performed, by using the non-abnormal air conditioner column, on the battery module corresponding to the abnormal air conditioner column, thereby reducing a difference between temperatures of the battery module corresponding to the abnormal air conditioner column and the battery module corresponding to the non-abnormal air conditioner column and improving temperature evenness of the energy storage system.

In a fifteenth possible implementation of the first aspect, the battery energy storage unit further includes a backflow prevention member, the backflow prevention member is located between the inner wall of the cabinet and a side that is of the battery energy storage unit and that is away from the air conditioner, and the drainage fan is mounted above the backflow prevention member.

In a sixteenth possible implementation of the first aspect, the battery energy storage unit further includes a power distribution component, and the power distribution component is mounted above the mounting component. The power distribution component and battery module are disposed in a same cabin, facilitating assembly of the energy storage system and allowing integrated mounting and transportation.

In a seventeenth possible implementation of the first aspect, the energy storage system further includes a direct current converter fastened on an outer side surface of the cabinet, and the direct current converter is configured to convert a voltage of the battery module.

In an eighteenth possible implementation of the first aspect, the air duct includes a first air duct and a second air duct, the first air duct is fastened to the air conditioner, the air supply vent is connected to the first air duct, one end of the second air duct and the first air duct are in a bent connection to and communicate with each other, an end that is of the second air duct and that is away from the first air duct is fastened to the battery energy storage unit, and the second air duct is connected to the first air duct and the first channel.

In a nineteenth possible implementation of the first aspect, the air guide plate further includes a fourth air guide plate fastened to and covering the support of the mounting rack at the end in the first direction, and the fourth air guide plate and the inner wall of the cabinet form a part of the first channel. The fourth air guide plate is configured to guide an airflow direction, so that an airflow cannot enter the battery energy storage unit from a gap on the support of the mounting rack at the end in the first direction.

BRIEF DESCRIPTION OF THE DRAWINGS

FIG. 8b is a side view of the energy storage system shown in FIG. 8a;

DETAILED DESCRIPTION OF THE EMBODIMENTS

In a temperature control solution of a battery energy storage system, at least two columns of battery modules are accommodated in a cabinet, and the cabinet includes a first surface and a second surface that are disposed opposite to each other. One air conditioner is built on the first surface and corresponds to one column of battery modules, one air conditioner is built on the second surface and corresponds to another column of battery modules, and an intermediate channel is disposed between the two columns of battery modules. Cold air blown out from each air conditioner enters the intermediate channel, and then passes through corresponding battery modules and returns to complete cooling the battery modules. However, in the temperature control solution, an air supply channel of the air conditioner and an air return channel of the air conditioner inside the cabinet are completely connected to each other, causing a relatively large loss of an amount of cold air blown out from the air conditioner and affecting heat dissipation efficiency. For example, if an air supply vent of one of two adjacent air conditioners in a same column is close to an air return vent of the other air conditioner, air emitted by the upper air conditioner directly returns to the lower air conditioner, causing a serious loss of coldness. In addition, if some of the air conditioners fail, temperatures of battery modules in different columns are uneven, a temperature of a battery module near an air supply channel of an air conditioner that does not fail is lower, and a temperature of a battery module near an air supply channel of the air conditioner that fails is higher.

Based on this, the embodiments may provide an energy storage system, including a cabinet, an air conditioner, a battery energy storage unit, and an air duct. The air conditioner is fastened to the cabinet, and the air conditioner includes an air supply vent and an air return vent. The battery energy storage unit is accommodated in the cabinet. A first channel and a second channel that are separated are formed between the battery energy storage unit and an inner wall of the cabinet. The second channel is connected to the air return vent. The battery energy storage unit includes an air intake vent and an air exhaust vent, the air intake vent is connected to the first channel, and the air exhaust vent is connected to the second channel. The air duct is accommodated in the second channel, and the air duct is connected to the air supply vent and the first channel, and is configured to guide, to the first channel, an airflow blown out from the air supply vent.

The following further describes the energy storage system based on implementations and the accompanying drawings.

Figure 1:
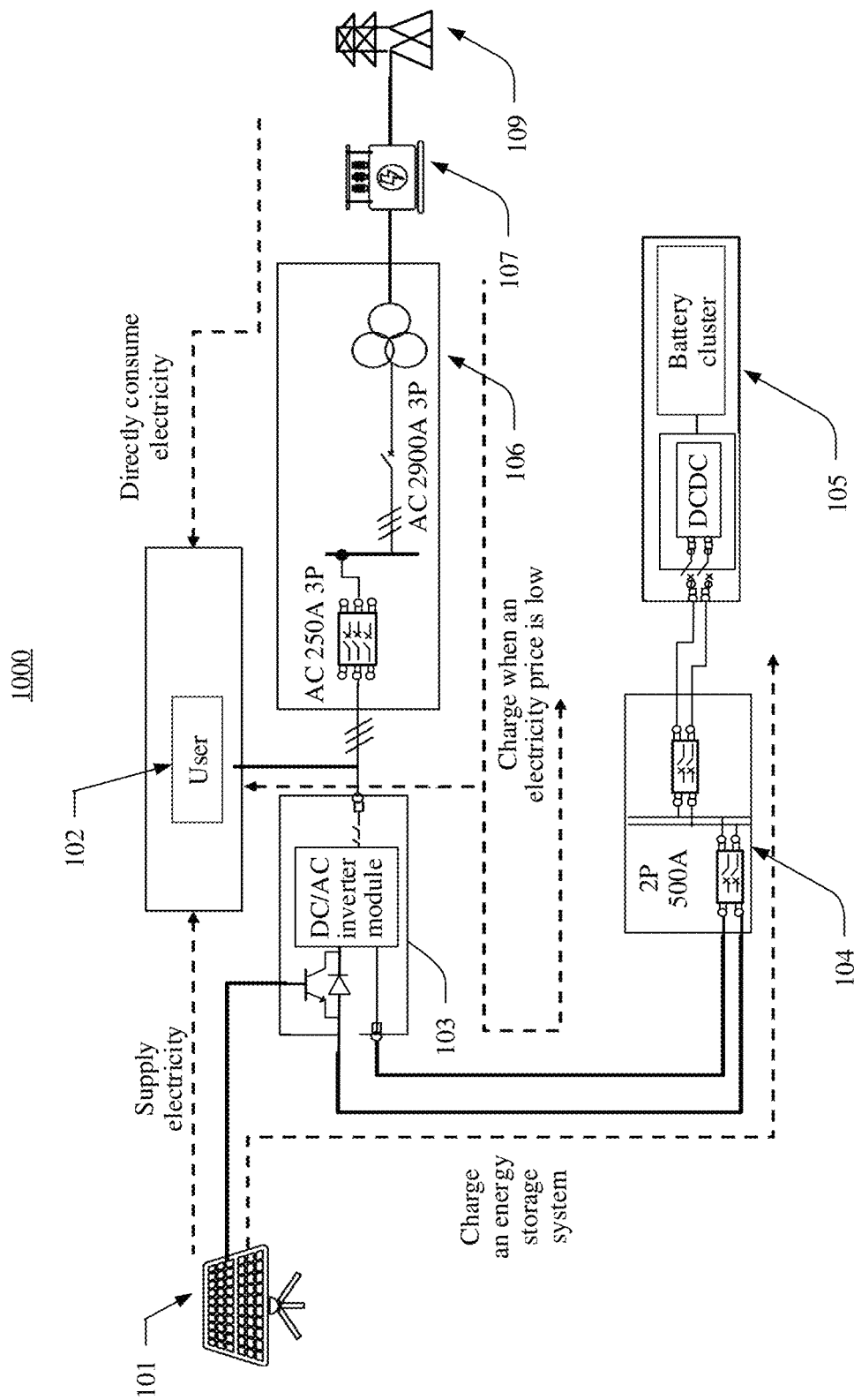
FIG. 1 is a schematic diagram of an application scenario of an electric energy application system according to an implementation.

FIG. 1 is a schematic diagram of an application scenario of an electric energy application system according to an implementation. An electric energy system 1000 includes a power generation system 101, an inverter system 103, a power conversion system (power control system, PCS) 104, an energy storage system 105, a static transfer switch (static transfer switch, STS) 106, a transformer 107, and a power grid 109. The power generation system 101 is configured to generate power and supply power. In this implementation, the power generation system 101 is a new energy generation system (for example, a solar photovoltaic power generation system), and generates a direct current by using new energy (for example, solar energy). The power generation system 101 is electrically connected to the inverter system 103. The inverter system 103 is configured to convert the direct current into an alternating current. The inverter system 103 is electrically connected to the energy storage system 105 by using the power conversion system 104, to store, in the energy storage system 105, electric energy generated by the power generation system 101. The inverter system 103 is electrically connected to the transformer 107 by using the static transfer switch 106, so that the power generation system 101 directly supplies power to the power grid 109. The inverter system 103 includes a DC/AC inverter module. The transformer 107 is configured to convert a voltage.

When generating electricity at high power, the power generation system 101 may supply electricity to a user 102, and also charge the energy storage system 105. The energy storage system 105 supplies electricity to the user 102 at a proper time by using the power conversion system 104, so that new energy power is consumed. When the power grid 109 has relatively small electrical load, power redundancy, and relatively low electricity costs (a relatively low electricity price), the power grid 109 reversely charges the energy storage system 105. When the power grid 109 has relatively large electrical load and relatively high electricity costs, the energy storage system 105 may discharge to the user 102, so that electricity costs are reduced.

Figure 2:
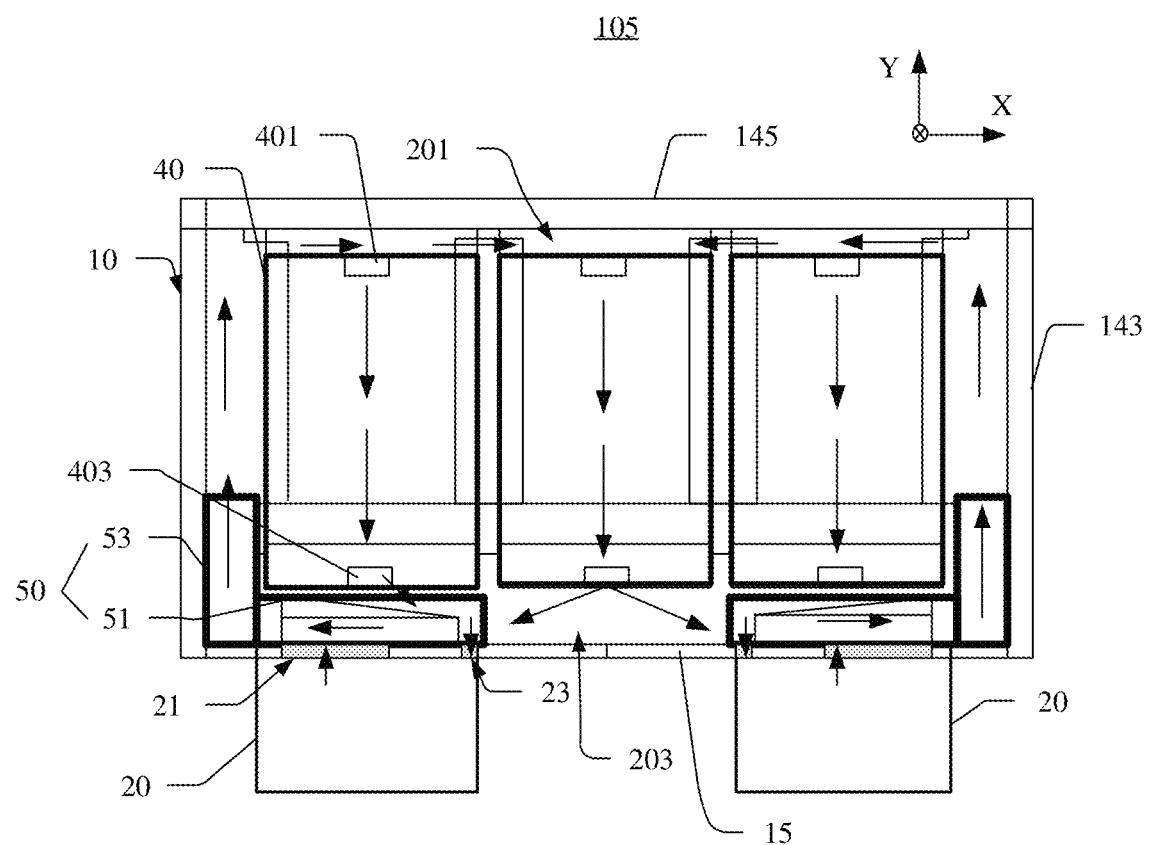
FIG. 2 is a schematic diagram of an airflow direction in an energy storage system according to an implementation.
Figure 3:
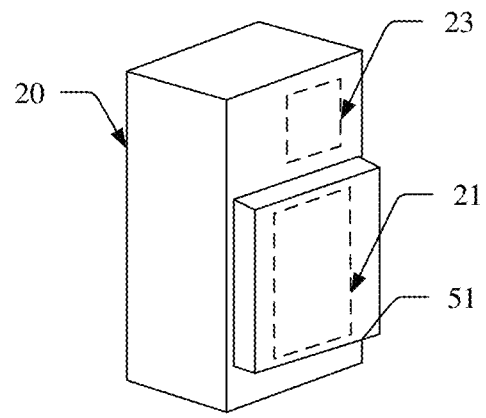
FIG. 3 is a schematic diagram of assembling an air conditioner and a first air duct of an air duct together according to an implementation.

Referring to FIG. 2, the energy storage system 105 includes a cabinet 10, an air conditioner 20, a battery energy storage unit 40, and an air duct 50. The air conditioner 20 is fastened to the cabinet 10. Referring to FIG. 3, the air conditioner 20 includes an air supply vent 21 and an air return vent 23. The air conditioner 20 blows out an airflow through the air supply vent 21. The battery energy storage unit 40 is accommodated in the cabinet 10 and is configured to store energy. A first channel 201 (as shown in FIG. 2) and a second channel 203 (as shown in FIG. 2) that are separated are formed between the battery energy storage unit 40 and an inner wall of the cabinet 10. The second channel 203 is connected to the air return vent 23. The battery energy storage unit 40 includes an air intake vent 401 and an air exhaust vent 403. The air intake vent 401 is connected to the first channel 201 and is configured to input an airflow flowing in the first channel 201 into the battery energy storage unit 40. The air exhaust vent 403 is connected to the second channel 203 and is configured to guide an airflow in the battery energy storage unit 40 to the second channel 13. The air duct 50 is accommodated in the second channel 203. The air duct 50 is connected to the air supply vent 21 and the first channel 201, and is configured to guide, to the first channel 201, the airflow blown out from the air supply vent 21.

It should be noted that, for ease of description, positions of the air supply vent 21 and the air return vent 23 of the air conditioner 20 shown in FIG. 2 and FIG. 3 are merely examples, and do not represent actual positions at which the air supply vent 21 and the air return vent 23 are disposed in the air conditioner 20, provided that an actual air conditioner 20 includes an air supply vent 21 and an air return vent 23.

For example, the airflow blown out from the air supply vent 21 of the air conditioner 20 is cold air. The airflow blown out from the air supply vent 21 of the air conditioner 20 directly enters the first channel 201 through the air duct 50, and then enters the inside of the battery energy storage unit 40 from the air intake vent 401 for cooling and heat dissipation to form hot air. The hot air flows out from the air exhaust vent 403, enters the second channel 203, and then returns to the air return vent 23 of the air conditioner 20 to implement circulation. In other words, the first channel 201 is an air supply channel used for the airflow blown out from the air supply vent 21 of the air conditioner 20 to enter the battery energy storage unit 40, and the second channel 203 is an air return channel used for the airflow flowing out of the battery energy storage unit 40 to return to the air conditioner 20.

Because the first channel 201 is separated from the second channel 203, the airflow flowing in the first channel 201 is cold air, and the airflow flowing in the second channel 203 is hot air, so that cold and hot channels are separated and a loss of a cold airflow is reduced, thereby improving heat dissipation efficiency and working reliability of the energy storage system 105. It should be noted that the cold air and the hot air are described relative to each other, and a temperature of the cold air is less than a temperature of the hot air.

It may be understood that, in some implementations, if the energy storage system 105 works under a cold condition (for example, a temperature of an environment in which the energy storage system 105 is located is not greater than 15 degrees below zero), to ensure that the battery energy storage unit 40 can work at a proper working temperature, the air conditioner 20 needs to increase a temperature of the battery energy storage unit 40. In this case, the airflow blown out from the air conditioner 20 through the air supply vent 21 is hot air, the airflow flowing in the first channel 201 is hot air, and the airflow flowing in the second channel 203 is cold air. The hot air blown out from the air supply vent 21 of the air conditioner 20 enters the first channel 201 through the air duct 50, and then enters the inside of the battery energy storage unit 40 from the air intake vent 401 for heating to form cold air. The cold air flows out from the air exhaust vent 403, enters the second channel 203, and then returns to the air return vent 23 of the air conditioner 20 to implement circulation.

The air duct 50 is disposed in the energy storage system 105. The air duct 50 is connected to the air supply vent 21 of the air conditioner 20 and the first channel 201. The air duct 50 can guide, to the first channel 201, the airflow (for example, a cold airflow) blown out from the air supply vent 21 of the air conditioner 20. In this implementation, the first channel 201 is disposed around the battery energy storage unit 40. The second channel 203 is located between the air conditioner 20 and the battery energy storage unit 40. The first channel 201 is disposed around the battery energy storage unit 40, so that a contact surface between the battery energy storage unit 40 and the airflow blown out from the air conditioner is increased. The first channel 201 is disposed around the battery energy storage unit 40, so that the airflow blown out from the air supply vent 21 of the air conditioner 20 can reach the air intake vent 401 of the battery energy storage unit 40, and then enter the inside of the battery energy storage unit 40. In this way, even if only one air conditioner 20 works, a function (for example, heat dissipation) performed by the air conditioner 20 on the entire battery energy storage unit 40 can be implemented, so that working reliability of the energy storage system 105 is improved.

Figure 4:
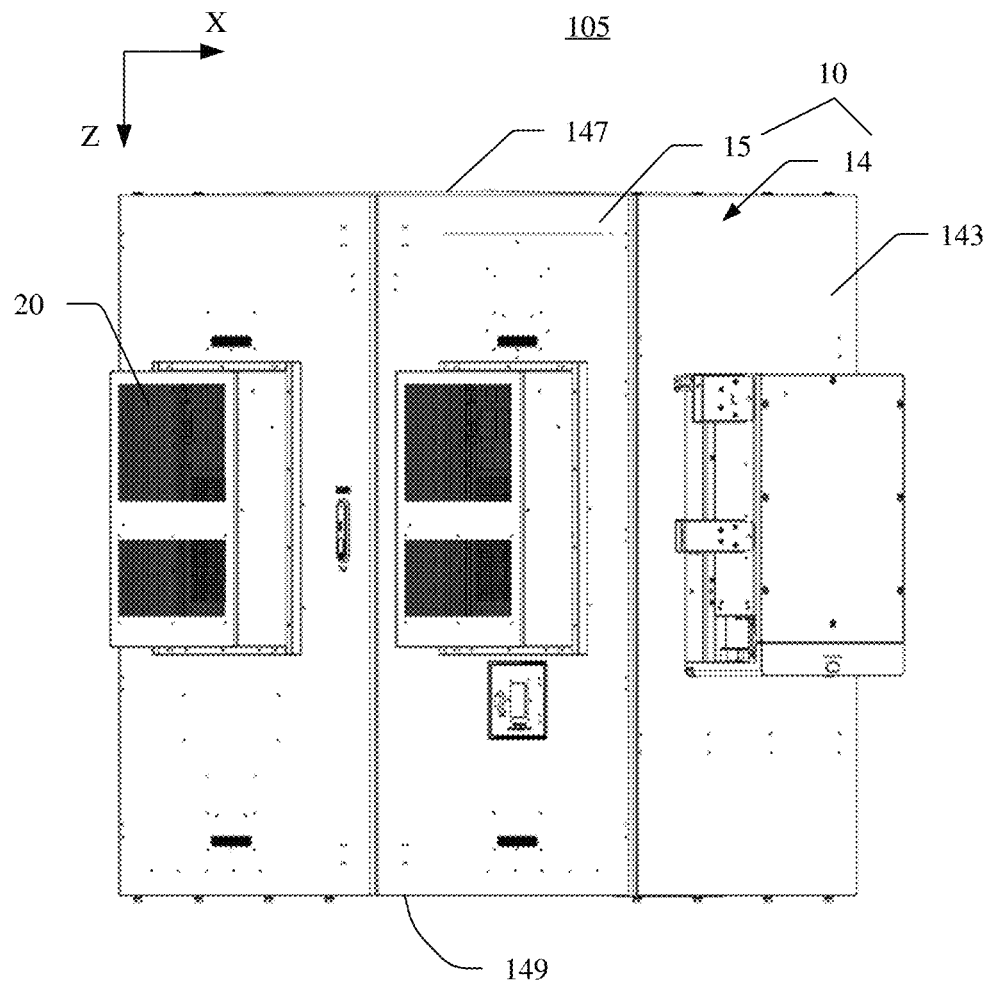
FIG. 4 is a three-dimensional schematic diagram of an energy storage system according to an implementation.
Figure 5:
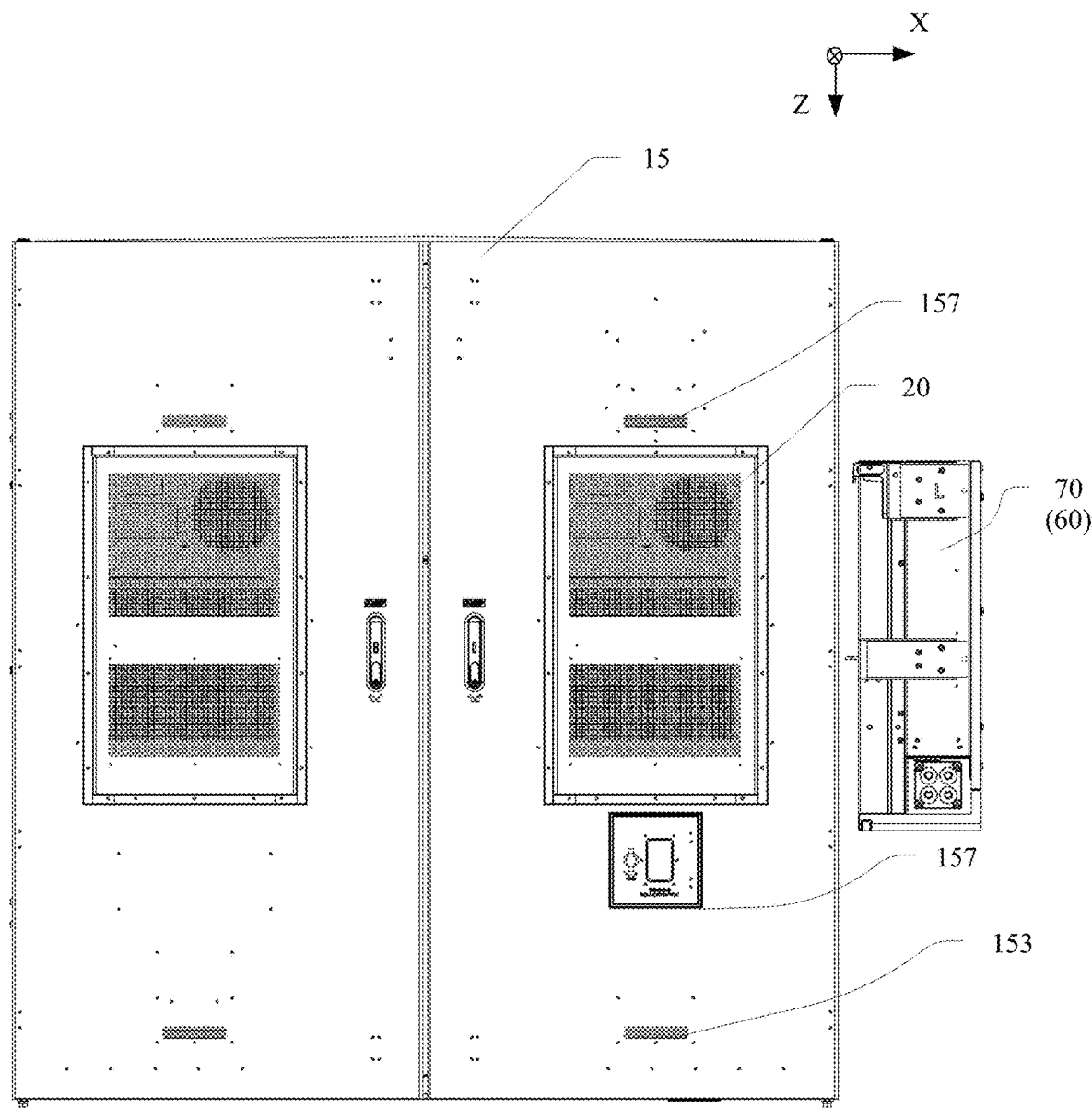
FIG. 5 is a front view of the energy storage system shown in FIG. 4.

Referring to FIG. 4 and FIG. 5, the cabinet 10 is approximately in a shape of a cuboid. The cabinet 10 includes a body 14 and two cabinet doors 15. The cabinet doors 15 are rotatably connected to the body 14. The two cabinet doors 15 are arranged in a first direction (for example, a direction X in FIG. 4). The two cabinet doors 15 are disposed side by side. The body 14 includes two side plates 143, a rear plate 145 (as shown in FIG. 2), a top plate 147 (as shown in FIG. 4), and a bottom plate 149 (as shown in FIG. 4). The two side plates 143 are disposed opposite to each other in the first direction. Each side plate 143 is connected to the rear plate 145 and the cabinet door 15. The cabinet doors 15 are rotatably connected to the side plates 143 in a one-to-one correspondence. The rear plate 145 and the cabinet door 15 are disposed opposite to each other in a second direction (for example, a direction Y in FIG. 2). The side plate 143 is connected to the top plate 147 and the bottom plate 149. The top plate 147 and the bottom plate 149 are disposed opposite to each other in a third direction (for example, a direction Z in FIG. 4). One column of air conditioners 20 arranged in the third direction is disposed on each cabinet door 15. The first direction is different from the second direction, the second direction is different from the third direction, and the third direction is different from the first direction. In this implementation, the first direction is perpendicular to the second direction, the second direction is perpendicular to the third direction, and the third direction is perpendicular to the first direction.

One column of air conditioners 20 arranged in the third direction is disposed on each cabinet door 15. The side plate 143, the rear plate 145, the top plate 147, and the battery energy storage unit 40 jointly form the first channel 201. The cabinet door 15, the side plate 143, the top plate 147, and the battery energy storage unit 40 jointly form the second channel 203. It may be understood that a shape of the cabinet 10 is not limited, provided that the inner wall of the cabinet 10 and the battery energy storage unit 40 form the first channel 201 and the second channel 203 that are separated.

A fire control air intake hole 153, a fire control air exhaust hole 155, and an emergency stop button 157 are further disposed on the cabinet door 15.

In this implementation, there are two air conditioners 20 in each column, in other words, there are a total of four air conditioners 20. Two air conditioners 20 are built on each cabinet 15. It should be noted that the air conditioner 20 usually further includes a fan, a condenser, an evaporator, a compressor, a throttle apparatus, and the like. Details are not described herein. It may be understood that there may be one air conditioner 20.

Figure 6:
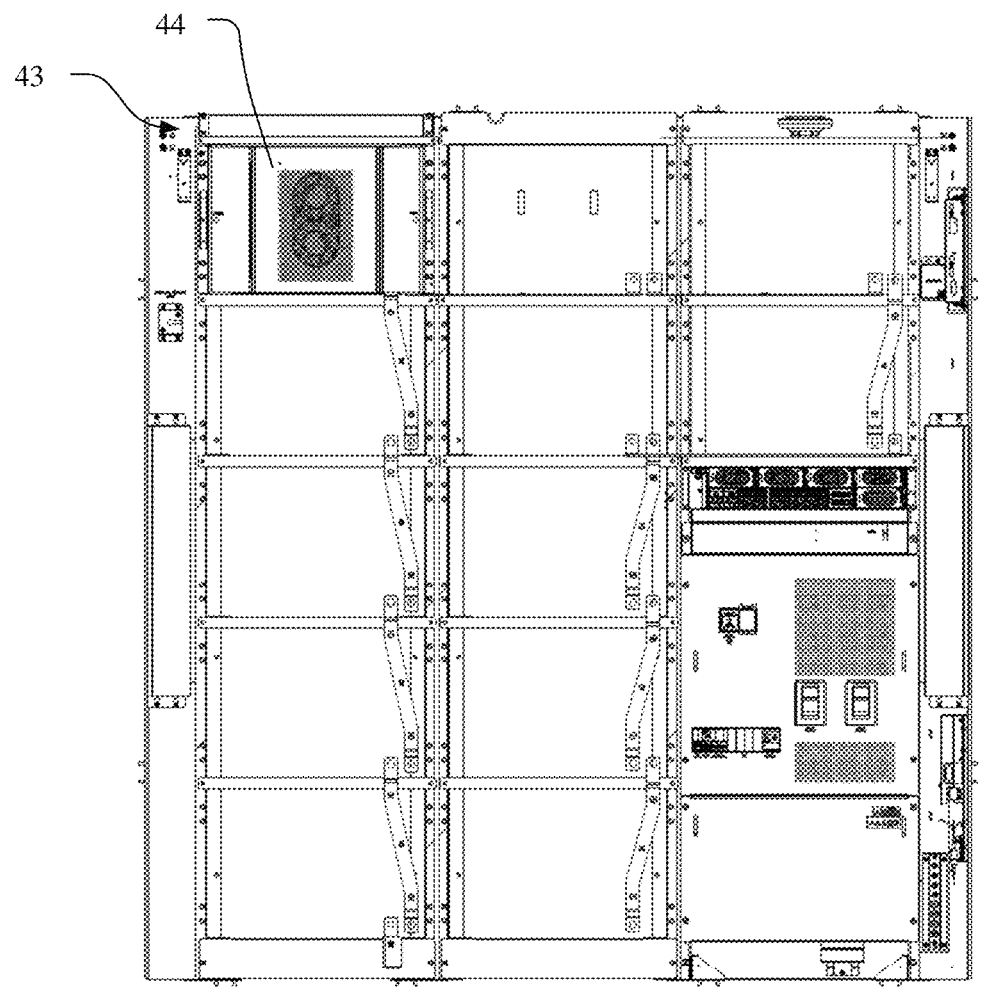
FIG. 6 is a front view of a partial structure of a battery energy storage unit according to an implementation.
Figure 7:
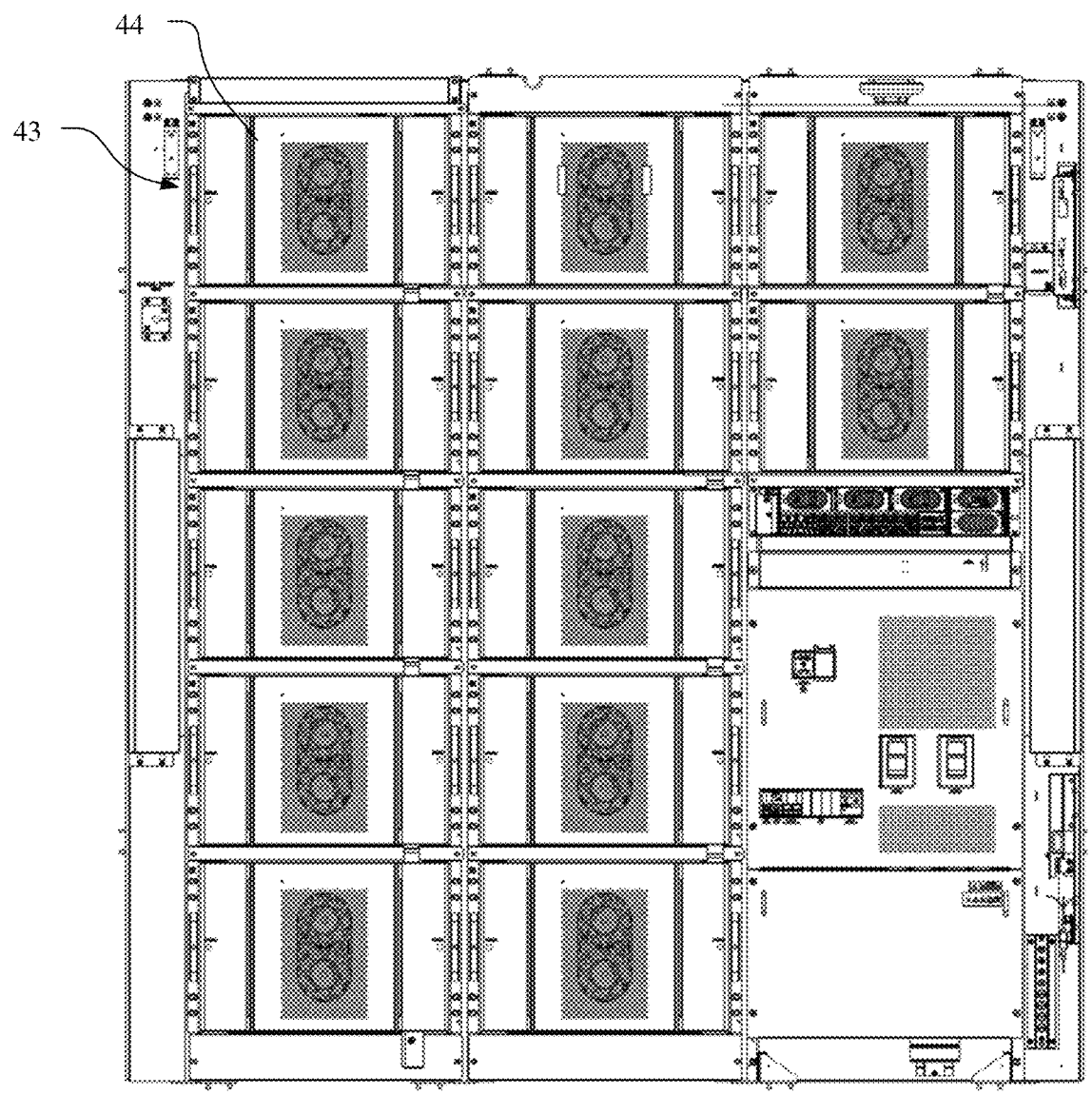
FIG. 7 is a front view of a partial structure of a battery energy storage unit according to an implementation.
Figure 8A:
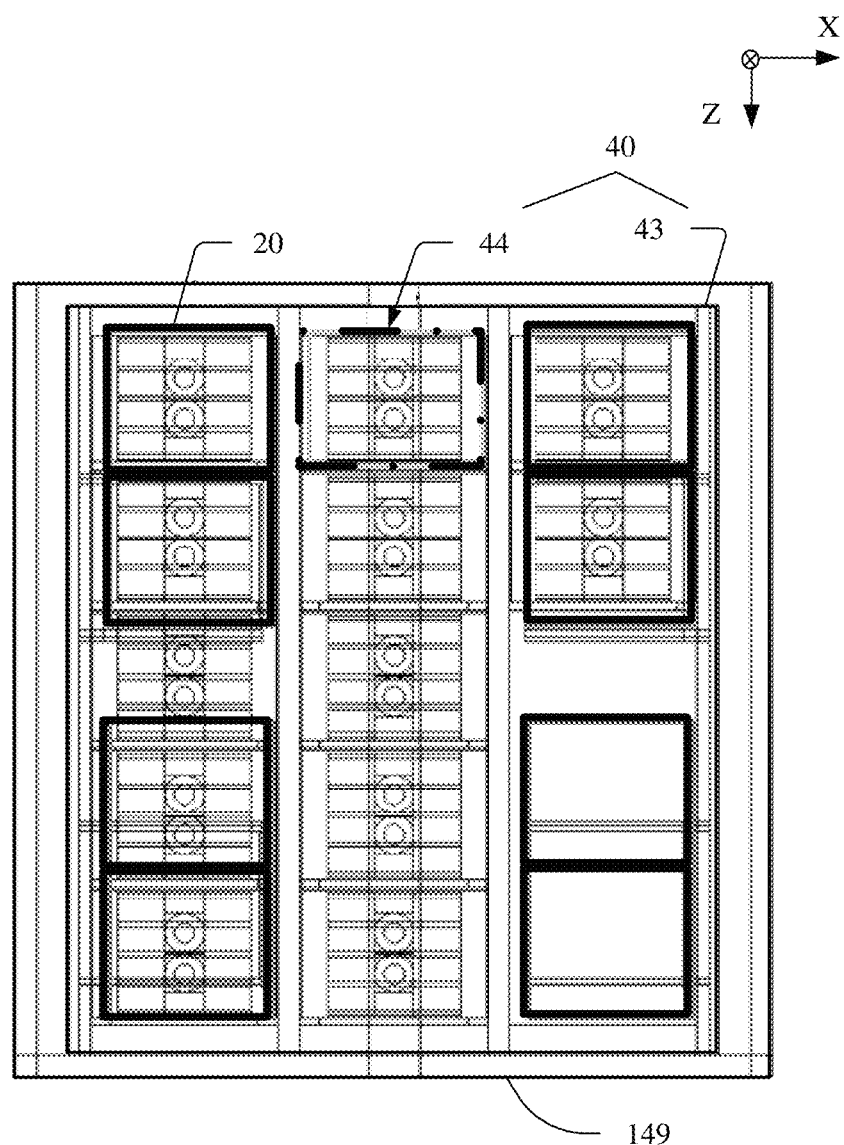
FIG. 8a is a schematic diagram of an energy storage system according to another implementation.
Figure 8B:
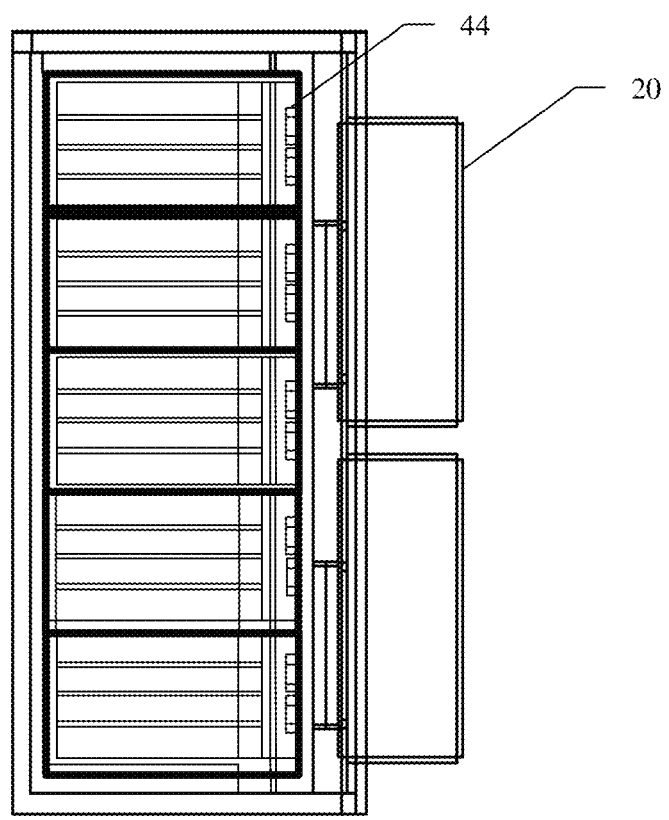

Referring to FIG. 6 and FIG. 7, the battery energy storage unit 40 includes a mounting component 43 and at least two columns of battery modules 44 mounted above the mounting component 43 in the first direction. The mounting component 43 is fastened and accommodated in the cabinet 10 and is in sealed contact with the inner wall of the cabinet 10. The mounting component 43 is configured to support the battery module 44. In this implementation, there are a total of three columns of battery modules 44 arranged in the first direction, and there are four battery modules 44 in each column. The air duct 50 is fastened to the mounting component 43. In another implementation, there may be one, two, or more battery modules 44 in each column. Referring to FIG. 8a and FIG. 8b, there are five battery modules 44 in each column.

Figure 9:
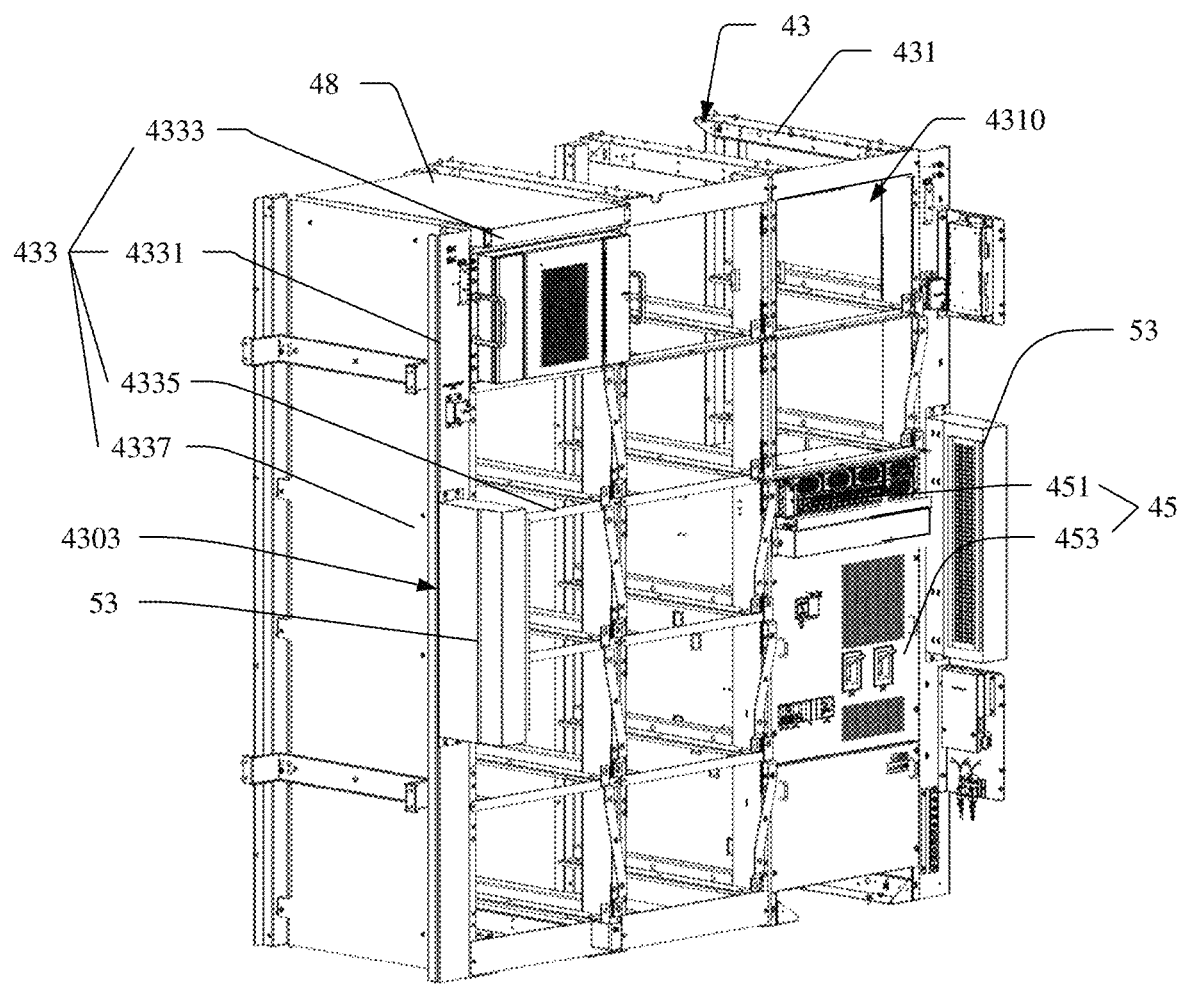
FIG. 9 is a three-dimensional schematic diagram of a battery energy storage unit whose partial structure is removed.
Figure 10:
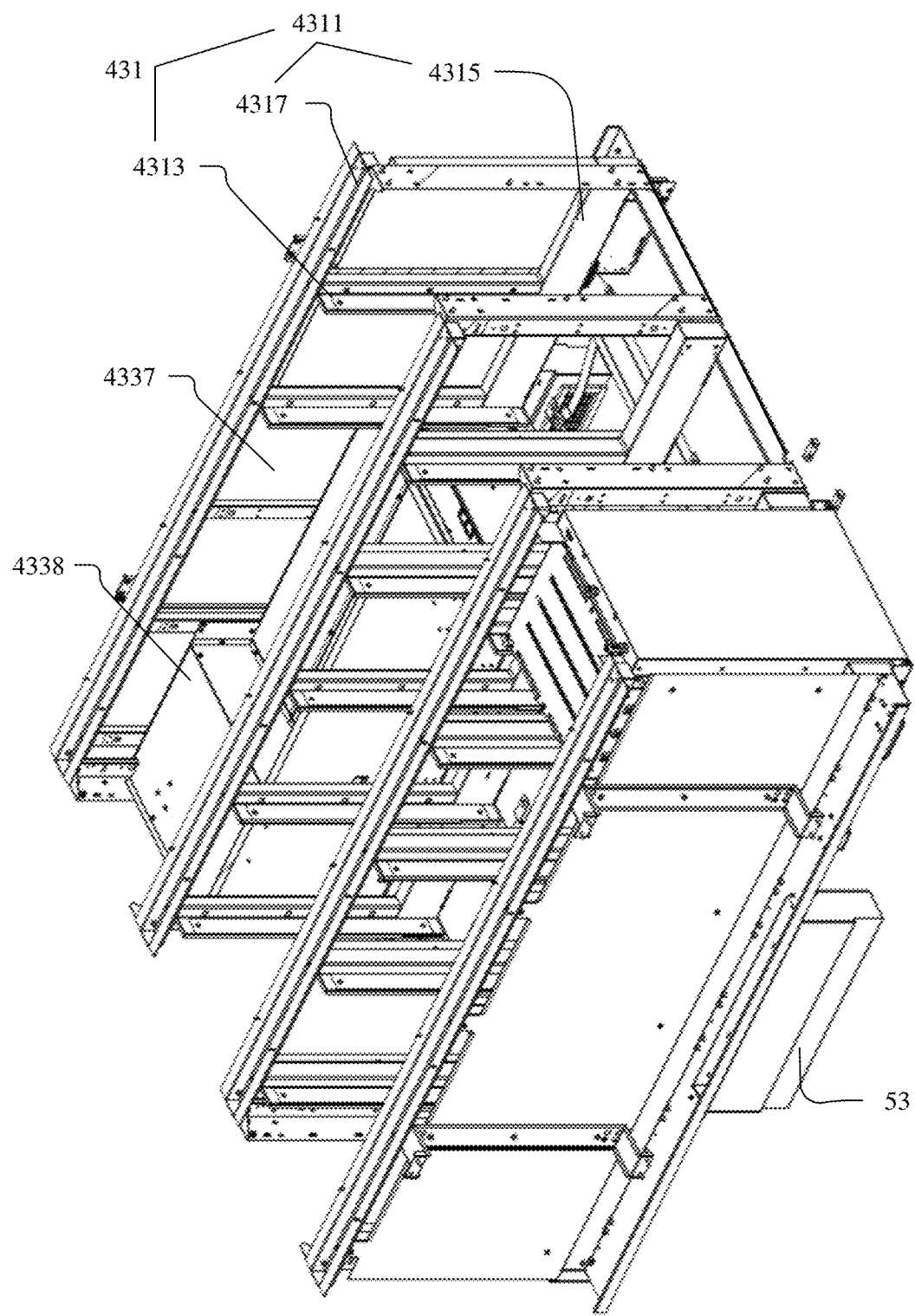
FIG. 10 is a schematic diagram of another angle of view of the battery energy storage unit shown in FIG. 9.

Referring to FIG. 9 and FIG. 10, the mounting component 43 includes a plurality of mounting racks 431 and an air guide plate 433. The plurality of mounting racks 431 are arranged in the first direction. One column of support positions 4310 is formed between every two adjacent mounting racks 431. Each battery module 44 is disposed on one support position 4310.

The mounting rack 431 includes a support 4311 and at least one guide rail 4313 fastened to the support 4311. The support 4311 includes a first support post 4315 and a second support post 4317 that are spaced apart in the second direction. Each guide rail 4313 is fastened between the first support post 4315 and the second support post 4317. The first support post 4315 is disposed on a side that is of the support 4311 and that is close to the air conditioner 20. The second support post 4317 is fastened to the rear plate 145 of the cabinet 10. A position of a guide rail 4313 on each support 4311 corresponds to that of a guide rail 4313 on an adjacent support 4311, so that the two adjacent mounting racks 431 jointly form the support position 4310 supporting the battery module 44. The battery module 44 is slidably connected to the guide rail 4313 in the second direction.

When the battery module 44 needs to be assembled onto the mounting component 43, the battery module 44 is directly pushed into the support position 4310 along the guide rail 4313, to facilitate assembly between the battery module 44 and the mounting component 43. When the battery module 44 needs to be removed from the mounting component 43, the battery module 44 is directly pulled and removed along the guide rail 4313, to facilitate removal of the battery module 44 from the mounting component 43. The second support post 4317 and a side that is of the battery module 44 and that is away from the air conditioner 20 are not aligned with each other, in other words, a gap exists between the second support post 4317 and the side that is of the battery module 44 and that is away from the air conditioner 20, so that the airflow in the first channel 201 flows to the battery module 44 from a side of the battery module 44.

It may be understood that the mounting rack 431 may include one or at least two guide rails 4313. All mounting racks 431 may include a same quantity or different quantities of guide rails 4313.

The air guide plate 433 is fastened on a side that is of the mounting rack 431 and that faces the air conditioner 20, and is in sealed contact with the inner wall of the cabinet 10, to cooperate with the mounting rack 431 and the battery module 44 to separate the first channel 201 from the second channel 203, so that a loss of a cold airflow or a hot airflow blown out from the air conditioner 20 can be reduced. The at least one air guide plate 433 includes a connection port 4303. The air duct 50 is connected to the first channel 201 by using the connection port 4303, and is configured to guide, to the first channel 201, the airflow blown out from the air conditioner 20.

In this implementation, the air guide plate 433 includes a first air guide plate 4331 and a second air guide plate 4333. The first air guide plate 4331 is fastened on a side that is of a mounting rack 431 at the end in the first direction and that faces the air conditioner 20 and is in sealed contact with the inner wall (for example, the side plate 143) of the cabinet 10. The first air guide plate 4331 extends in the third direction. A connection port 4303 is disposed on the first air guide plate 4331. The air duct 50 is fastened to the first air guide plate 4331.

The second air guide plate 4333 is located on a side that is of the mounting rack 431 and that faces the air conditioner 20 and is in sealed contact with the inner wall of the cabinet 10. The second air guide plate 4333 extends in the second direction to separate the first channel 201 from the second channel 203. In this implementation, there are a plurality of second air guide plates 4333, each second air guide plate 4333 is fastened between two adjacent mounting racks 431, a second air guide plate 4333 located at an end that is of the mounting rack 431 and that is close to the top plate 147 is in sealed contact with the top plate 147, and a second air guide plate 4333 located at an end that is of the mounting rack 431 and that is close to the bottom plate 149 is in sealed contact with the bottom plate 149.

A gap is formed between every two adjacent battery modules 44 in a same column of battery modules 44. The air guide plate 433 further includes a plurality of third air guide plates 4335 extending in the second direction. Each third air guide plate 4335 is fastened to sides that are of two adjacent mounting racks 431 and that face the air conditioner 20 to cover a corresponding gap formed between every two adjacent battery modules 44 in a same column of battery modules 44, to separate the first channel 201 from the second channel 203.

The air guide plate 433 further includes a fourth air guide plate 4337 fastened to and covering a support 4311 of the mounting rack 431 at the end in the first direction, and the fourth air guide plate 4337 and the side plate 143 form a part of the first channel 201. The fourth air guide plate 4337 is configured to guide an airflow direction, so that an airflow cannot enter the battery energy storage unit 40 from a gap on the support 4311 of the mounting rack 431 at the end in the first direction.

The air guide plate 433 further includes a fifth air guide plate 4338, and the fifth air guide plate 4338 may be fastened between two mounting racks 431 (for example, corresponding guide rails 4313), for example, to an idle support position 4310, to prevent an airflow from directly entering a nearby battery module 44.

The first air guide plate 4331, the second air guide plate 4333, the third air guide plate 4335, the fourth air guide plate 4337, and the fifth air guide plate 4338 are disposed to effectively prevent an airflow from entering the inside of the battery energy storage unit 40 from a side that is of the battery energy storage unit 40 and that faces the air conditioner 20, so that the airflow is "forced" to enter the first channel 201, and the airflow blown out from the air supply vent 21 of the air conditioner 20 can reach a side that is of the battery energy storage unit 40 and that is away from the air conditioner 20.

Figure 11:
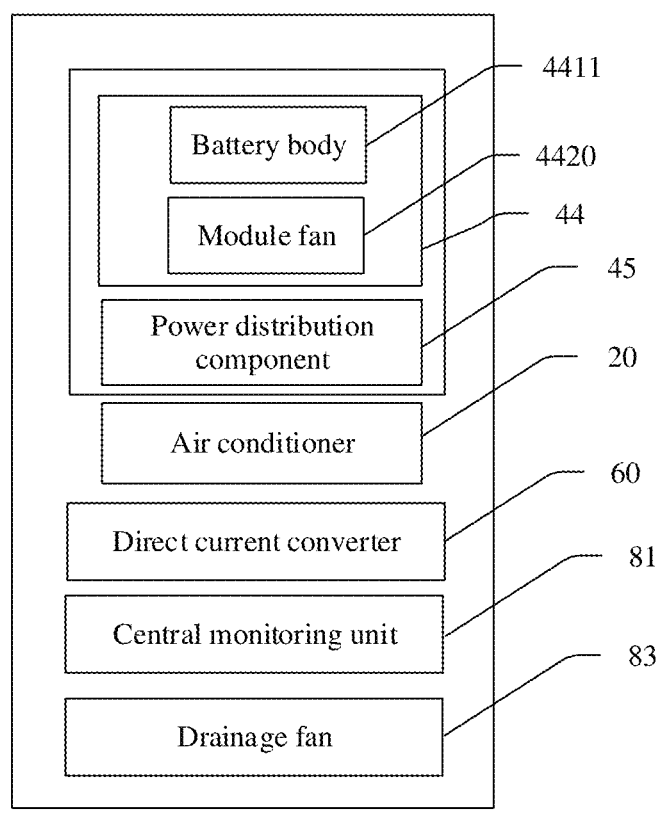
FIG. 11 is a block diagram of a structure of an energy storage system.
Figure 12:
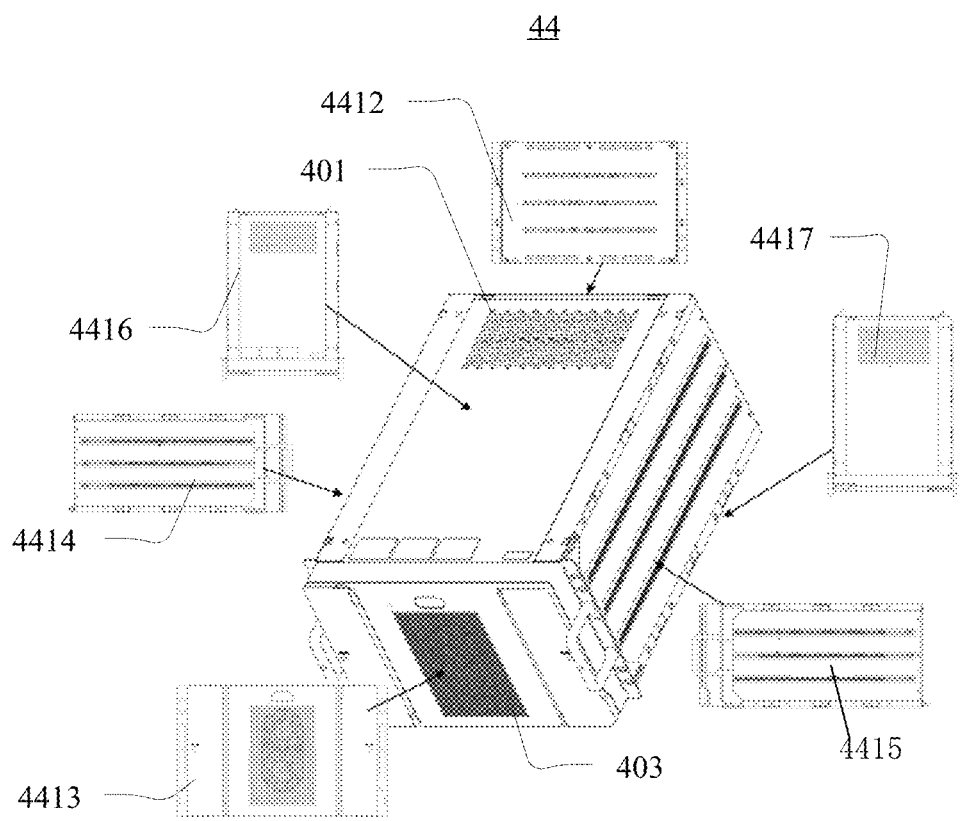
FIG. 12 is a schematic diagram of a battery module and surfaces of the battery module.
Figure 13:
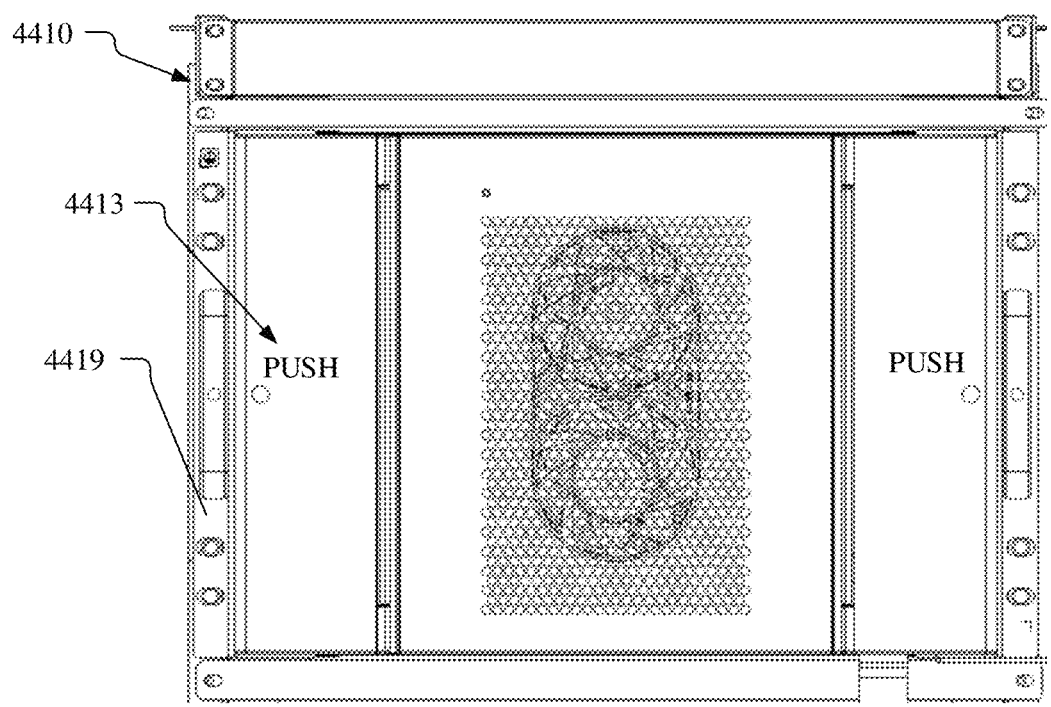
FIG. 13 is a front view of a battery module.

Referring to FIG. 11, FIG. 12, and FIG. 13, the battery module 44 includes a housing 4410 and a battery body 4411 accommodated in the housing 4410. The housing 4410 includes a first air intake surface 4412 and an air exhaust surface 4413 that are disposed opposite to each other in the second direction. The first air intake surface 4412 is disposed toward the rear plate 145, and the first air intake surface 4412 may be considered as being located on a rear side of the battery module 44. The air exhaust surface 4413 is located on a side that is of the battery module 44 and that faces the second channel 203, and the air exhaust surface 4413 may be considered as being located on a front side of the battery module 44. An air intake vent 401 is disposed on the first air intake surface 4412. An air exhaust vent 403 is disposed on the air exhaust surface 4413. Because the first channel 201 is disposed around the battery energy storage unit 40, and is connected to the air intake vent 401, the airflow blown out from the air conditioner 20 may pass through the first channel 201 and flow to the rear side that is of the battery module 44 and that is away from the air conditioner 20, to implement air intake from the rear side of the battery module 44 and air return from the front side of the battery module 44.

A gap between air exhaust surfaces 4413 of two adjacent battery modules 44 arranged in the third direction is sealed and covered by the second air guide plate 4333, so that the airflow in the second channel 203 is less prone to enter the first channel 201 from a gap between air exhaust surfaces 4413 of two adjacent battery modules 44 arranged in the third direction.

In this implementation, the housing 4410 may have a multi-sided air intake to improve heat dissipation and cooling effects. The housing 4410 further includes a second air intake surface 4414, a third air intake surface 4415, a fourth air intake surface 4416, and a fifth air intake surface 4417. The second air intake surface 4414 and the third air intake surface 4415 are disposed opposite to each other in the second direction. The second air intake surface 4414 is disposed toward one side plate 143, and the third air intake surface 4415 is disposed toward the other side plate 143. The fourth air intake surface 4416 and the fifth air intake surface 4417 are disposed opposite to each other in the third direction. The fourth air intake surface 4416 is disposed on a side that is of the battery module 44 and that faces the top plate 147, and the fifth air intake surface 4417 is disposed on a side that is of the battery module 44 and that faces the bottom plate 149. At least one air intake vent 401 is disposed on each of the second air intake surface 4414, the third air intake surface 4415, the fourth air intake surface 4416, and the fifth air intake surface 4417.

It may be understood that a quantity of air intake surfaces of the battery module 44 and areas of the air intake surfaces are not limited. The multi-sided cooling may also be applicable to a battery module without a fan. Cold air of the air conditioner flows through a surface of the battery module to improve a multi-sided cooling effect.

The first air intake surface 4412 and the second support post 4317 of the mounting rack 431 are not aligned with each other. For every two adjacent battery modules 44 in the first direction, a second air intake surface 4414 of one battery module 44 and a third air intake surface 4415 of the other battery module 44 are disposed opposite to each other and a gap is formed, and the airflow flowing in the first channel 201 can enter the inside of the battery energy storage unit 40 from the gap between the adjacent battery modules 44, and then enter the inside of the battery module 44 from the second air intake surface 4414 and the third air intake surface 4415, to implement air intake from a side of the battery module 44.

Because the guide rail 4313 is suspended, for every two adjacent battery modules 44 in the third direction, a fourth air intake surface 4416 of one battery module 44 and a fifth air intake surface 4417 of the other battery module 44 are disposed opposite to each other and a gap is formed, and the airflow in the first channel 201 enters the inside of the battery module 44 from the fourth air intake surface 4416 and the fifth air intake surface 4417, to implement air intake from an upper side/a lower side of the battery module 44.

Referring to FIG. 13, the battery module 44 further includes a mounting ear 4419. The mounting ear 4419 protrudes on an edge region of the air exhaust surface 4413, and the mounting ear 4419 is fastened to and in a sealed connection to the side that is of the support 4311 of the mounting rack 431 and that faces the air conditioner 20, to improve connection stability between the battery module 44 and the mounting component 43. A side that is of the mounting rack 431 and that is away from the air conditioner 20 is fastened to the body 14 of the cabinet 10.

Because the first air guide plate 4331 in sealed contact with the inner wall of the cabinet 10 is added to the mounting rack 4301 at the end in the first direction, the mounting rack 431 and the inner wall of the cabinet 10 are in sealed contact by using the second air guide plate 4333, a gap between adjacent battery modules 44 in the third direction is sealed and covered by the third air guide plate 4335, and both sides of the battery module 44 are sealed by using the mounting ear 4419, cold and hot separation between the first channel 201 and the second channel 203 is finally implemented, and cold air blown out from the air conditioner 20 passes through only the battery module 44.

Referring to FIG. 9 again, the battery energy storage unit 40 further includes a power distribution component 45 electrically connected to the plurality of battery modules 44, and the power distribution component 45 functions as a switch to control the battery module 44 and an external device to be electrically connected or disconnected. The power distribution component 45 is disposed on a support position 4310. The power distribution component 45 and the battery module 44 are jointly mounted on the same mounting component 43 and accommodated in the same cabinet 10, in other words, the power distribution component 45 and the battery module 44 are disposed in a same cabin. In this way, it is convenient to assemble, transport, and maintain the energy storage system 105.

The power distribution component 45 includes a power distribution element 451 and a power distribution cover 453. The power distribution element 451 is fastened to a support position 4310 of the mounting component 43. The power distribution cover 453 is fastened to the mounting rack 431 of the mounting component 43, covers a side that is of the power distribution element 451 and that faces the air conditioner 20, and is configured to separate the first channel 201 (as shown in FIG. 2) from the second channel 203 (as shown in FIG. 2), to reduce a loss of an amount of cold air or hot air blown out from the air conditioner 20. A hole is disposed on the power distribution cover 453 and is configured to dissipate heat of the power distribution element 451.

In this implementation, the energy storage unit 40 further includes a fire control module 48 mounted above the mounting component 43, and the fire control module 48 is configured to prevent a fire.

In this implementation, a quantity of air ducts 50 corresponds to a quantity of air conditioners 20. Each air duct 50, an air supply vent 21 of one air conditioner 20, and one connection port 4303 of a first air guide plate 4331 are disposed, to directly guide the airflow blown out from the air conditioner 20 to the first channel 201.

Referring to FIG. 2 and FIG. 3 again, the air duct 50 includes a first air duct 51 and a second air duct 53. The first air duct 51 is approximately a wedge-shaped cover. The first air duct 51 and the air conditioner 20 may be disposed as an integral, or the first air duct 51 and the air conditioner 20 may be separated from each other. The first air duct 51 is fastened to the air conditioner 20, and the air supply vent 21 is connected to the first air duct 51. One end of the second air duct 53 and the first air duct 51 are in a bent connection to and communicate with each other. An end that is of the second air duct 53 and that is away from the first air duct 51 is fastened to one first air guide plate 433 and connected to the connection port 4303, and the second air duct 53 is connected to the first air duct 51 and the first channel 201 by using the connection port 4303. In this implementation, one end of the first air duct 51 is in a sealed connection to the air supply vent 23 of the air conditioner 20, so that the first channel (for example, a cold channel) 201 is sealed, air is supplied from both sides of the battery energy storage unit 40, and air returns from the side that is of the battery energy storage unit 40 and that faces the air conditioner 20.

Figure 14:
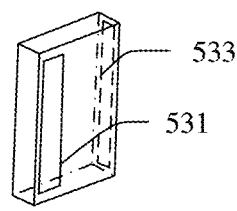
FIG. 14 is a schematic diagram of a second air duct of an air duct.

The bent connection between the second air duct 53 and the first air duct 51 is approximately L-shaped. In this implementation, referring to FIG. 14, the second air duct 53 is approximately in a shape of a cuboid, and an inlet 531 and an outlet 533 are disposed on a side surface of the second air duct 53. The inlet 531 is connected to the first air duct 51, and the outlet 533 is connected to the connection port 4303.

Figure 15:
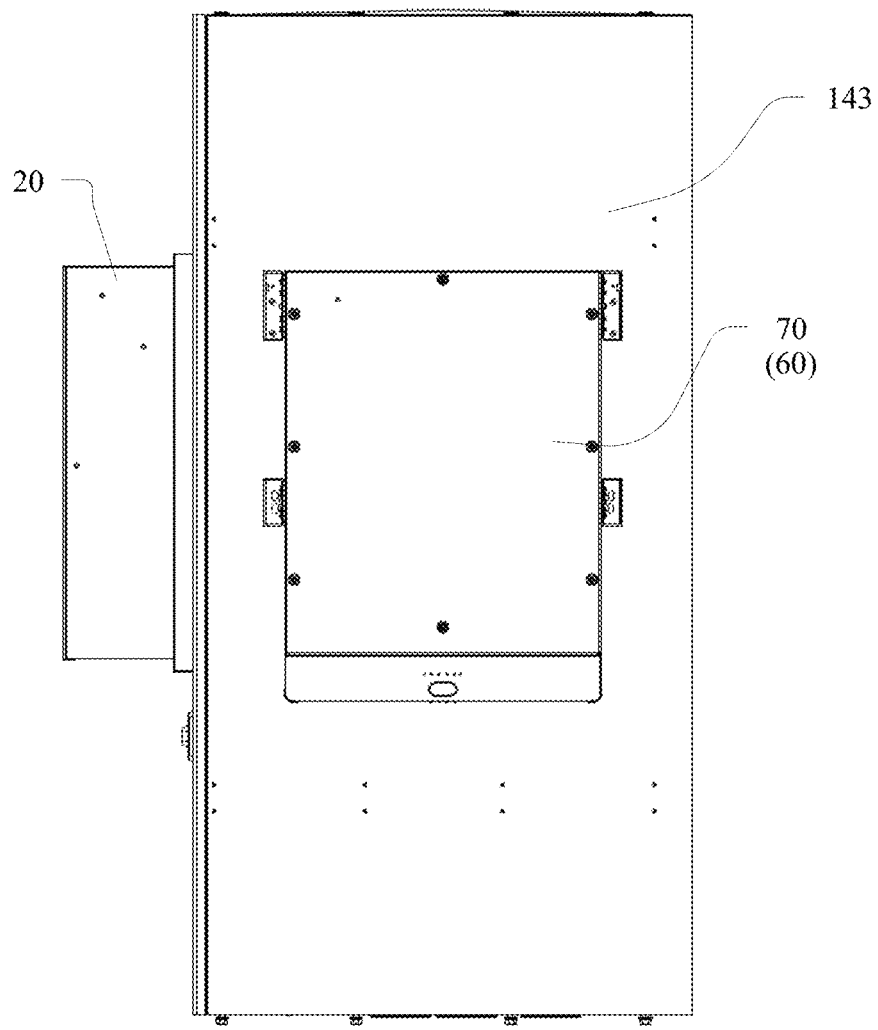
FIG. 15 is a side view of the energy storage system shown in FIG. 4.

In this implementation, every three battery modules 44 constitute one battery cluster. Referring to FIG. 11 again, the energy storage system 105 further includes a direct current (DCDC) converter 60 and a protective cover 70 (as shown in FIG. 1 and FIG. 15). The direct current converter 60 is fastened to an outer side surface of the side plate 143. Each direct current converter 60 corresponds to one battery cluster and is configured to convert a voltage of a battery module 44 in the battery cluster. It may be understood that a quantity of direct current converters 60 is not limited, and a quantity of battery clusters corresponding to one direct current converter 60 is not limited. For example, one direct current converter 60 corresponds to a plurality of battery clusters. The protective cover 70 is fastened to an outer side surface that is of the side plate 143 and that is away from the cabinet 10. The protective cover 70 is disposed outside four direct current converters 60 and is configured to protect the direct current converters 60. The protective cover 70 includes a first connection part and a second connection part that are connected to each other. Both the first connection part and the second connection part are fastened to the cabinet 10, and a heat dissipation hole is disposed on the first connection part. The first connection part includes a waterproof shutter, and the shutter includes the heat dissipation hole. The second connection part is disposed near the top plate in the protective cover, and the second connection part is solid (no hollow region is disposed for heat dissipation), to prevent dust.

In this implementation, the battery module 44 used for energy storage, the direct current converter 60, and the power distribution component 45 are integrated as an integral in the energy storage system 105, to effectively improve energy density of the entire energy storage system 105 and achieve good temperature control performance.

There are at least two air conditioners 20. The at least two air conditioners 20 are arranged into two air conditioner columns in the first direction. Each column of air conditioners 20 corresponds to at least one column of battery modules 44. If an exception occurs in one air conditioner column, an amount of cold air/hot air received by a battery module that is in the battery energy storage unit and that is close to a non-abnormal air conditioner column is greater than an amount of cold air/hot air received by a battery module 44 that is in the battery energy storage unit and that is close to the abnormal air condition column, and therefore temperature evenness of the battery energy storage unit may be affected.

The energy storage system 105 further includes a temperature adjustment system, and the temperature adjustment system includes a central monitoring unit (central monitoring unit, CMU) 81 and a module fan 4420. The central monitoring unit 81 is communicatively connected to all air conditioners 20 and is configured to monitor working statuses of all the air conditioners 20. The module fan 4420 is accommodated in the housing 4410 (as shown in FIG. 12) of the battery module 44 and is configured to adjust a flow velocity of an airflow in the battery module 44. The module fan 4420 is communicatively connected to the central monitoring unit 81. The central monitoring unit 81 determines an abnormal air conditioner column in which an exception occurs. The central monitoring unit 81 controls a module fan 4420 corresponding to the abnormal air conditioner column to adjust a speed, and usually to increase the speed. When a temperature of a battery module 44 corresponding to the abnormal air conditioner column reaches a preset target temperature, a rotational speed of the battery module 44 corresponding to the abnormal air conditioner column remains at a current rotational speed. The preset target temperature is a temperature of the battery module 44 when there is no abnormal air conditioner column in the energy storage system 105.

The exception means that a quantity of normally working air conditioners in an air conditioner column is less than a preset quantity of normally working air conditioners. Exceptions include a failure and configuration reduction. The failure means that the air conditioner 20 is faulty and cannot blow out cold air or hot air. The configuration reduction means that a quantity of air conditioners in an air conditioner column is less than the preset quantity of normally working air conditioners. The two columns of air conditioners 20 usually include a same quantity of air conditioners 20. For example, a preset quantity of normally working air conditioners in each column is 2. If a quantity of air conditioners 20 in one column decreases from 2 to 1, configuration reduction occurs. Both the failure and the configuration reduction can be detected by monitoring a feedback signal exception of a fans and/or a feedback signal exception of a compressor inside the air conditioner 20 by the central monitoring unit 81.

It may be understood that the failure and the configuration reduction can be detected in other manners, for example, by monitoring a temperature of each connection port 4303.

Figure 16:
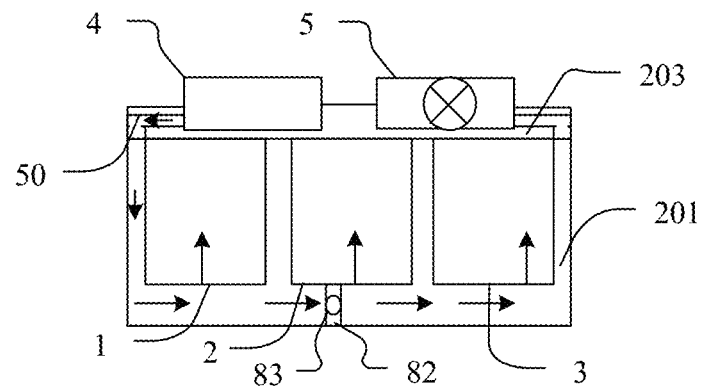
FIG. 16 is a diagram of an airflow direction in an energy storage system when an exception occurs in an air conditioner column.

As shown in FIG. 16, in this implementation, there are 12 battery modules 44, and the 12 battery modules 44 are arranged in three columns on a plurality of support positions 4310. The three columns of battery modules 44 include a battery module column 1, a battery module column 2, and a battery module column 3 that are sequentially arranged in the first direction. The two columns of air conditioners 20 include a first air conditioner column 4 and a second air conditioner column 5 that are arranged in the first direction. The battery module column 1 corresponds to the first air conditioner column 4, and the battery module column 3 corresponds to the second air conditioner column 5.

The temperature adjustment system 80 further includes a drainage fan 83. The drainage fan 83 is located in the first channel 201 and is configured to adjust a flow velocity of the airflow in the first channel 201. In this implementation, the battery energy storage unit 40 further includes a backflow prevention member 82, the backflow prevention member 82 is located between the rear plate 145 and the side that is of the battery energy storage unit 40 and that is away from the air conditioner 20, and the drainage fan 83 is mounted above the backflow prevention member 82. An airflow can be prevented from returning while the drainage fan 83 is supported. The drainage fan 83 is a reversible flow fan, in other words, can rotate forward and backward. The central monitoring unit 81 controls the module fan 4420 to rotate when an exception occurs in a corresponding column of air conditioners 20, to increase a flow velocity of an airflow inside the battery module 44.

The drainage fan 83 may include a first air surface and a second air surface that are disposed opposite to each other in the first direction. The first air surface is disposed on a side that is of the drainage fan and that is close to the first air conditioner column 4, and the second air surface is disposed on a side that is of the drainage fan 83 and that is close to the second air conditioner column 5. When the drainage fan 83 rotates forward, the first air surface is an air intake surface of the drainage fan 83, and the second air surface is an air exhaust surface. When the drainage fan 83 rotates backward, the first air surface is an air exhaust surface of the drainage fan 83, and the second air surface is an air intake surface. When determining that an exception occurs in the first air conditioner column 4, the central monitoring unit 81 controls the drainage fan 83 to rotate backward to guide the airflow in the first channel 201 from the battery module column 3 to the battery module column 1. When determining that an exception occurs in the second air conditioner column 5, the central monitoring unit 81 controls the drainage fan 83 to rotate forward to guide the airflow in the first channel 201 from the battery module column 1 to the battery module column 3. In this way, a difference between temperatures of a battery module 44 corresponding to an abnormal air conditioner column and a battery module 44 corresponding to a non-abnormal air conditioner column is reduced, so that temperature evenness of the energy storage system 105 is improved. In other words, the air exhaust surface of the drainage fan 83 faces a side on which the battery module 44 corresponding to the abnormal air conditioner column is located.

The central monitoring unit 81 monitors the working statuses of all the air conditioners 20 and a temperature of each column of battery modules 44. When determining an abnormal air conditioner column from the first air conditioner column 4 and the second air conditioner column 5, the central monitoring unit 81 controls a rotational speed of a module fan 4420 in a corresponding column of battery modules 44 to increase, and/or controls a rotation direction of a fan blade of the drainage fan 83. When a difference between a temperature of the battery module column 1 and a temperature of the battery module column 3 falls within a preset temperature range, the central monitoring unit 81 controls the module fan 4420 to stop rotating, and controls the drainage fan 83 to stop rotating, in other words, the temperature adjustment system 81 stops temperature adjustment.

It may be understood that the drainage fan 83 may be omitted from the battery energy storage unit 40, and the module fan 4420 may be omitted from the battery module 44.

Figure 17:
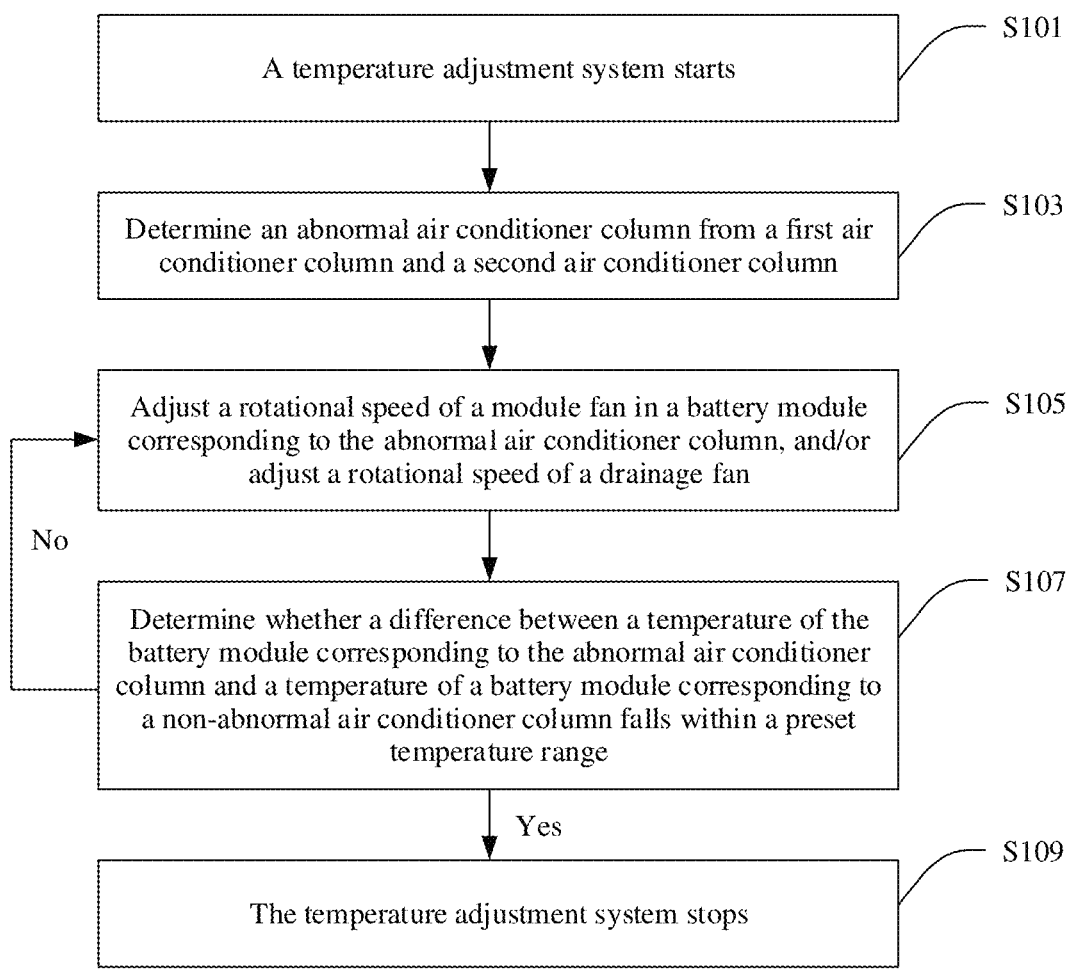
FIG. 17 is a flowchart of a control method for an energy storage system according to an implementation.

Referring to FIG. 17, the embodiments may further provide a temperature adjustment control method for an energy storage system 105. The method includes the following steps.

Step S101: A temperature adjustment system starts.

Step S103: Determine an abnormal air conditioner column from a first air conditioner column 4 and a second air conditioner column 5.

Step S105: Adjust a rotational speed of a module fan 4420 in a battery module 44 corresponding to the abnormal air conditioner column, and/or adjust a rotational speed of a drainage fan 83, where an air exhaust surface of the drainage fan 83 faces a side on which the battery module corresponding to the abnormal air conditioner column is located.

Step S107: whether a difference between a temperature of the battery module 44 corresponding to the abnormal air conditioner column and a temperature of a battery module corresponding to a non-abnormal air conditioner column falls within a preset temperature range. If the difference between the temperature of the battery module 44 corresponding to the abnormal air conditioner column and the temperature of the battery module 44 corresponding to the non-abnormal air conditioner column falls within the preset temperature range, step S109 is performed, and the module fan 4420 in the battery module 44 corresponding to the abnormal air conditioner column works at the current rotational speed, and/or the drainage fan 83 works at the current rotational speed. If the difference between the temperature of the battery module 44 corresponding to the abnormal air conditioner column and the temperature of the battery module 44 corresponding to the non-abnormal air conditioner column falls beyond the preset temperature range, step S105 is re-performed.

Step 109: The temperature adjustment system stops, the module fan 4420 in the battery module 44 corresponding to the abnormal air conditioner column exits the speed adjustment, and the drainage fan 83 exits the speed adjustment.

It should be understood that expressions such as "include" and "may include" that may be used represent the existence of functions, operations, or constituent elements, and do not limit one or more additional functions, operations, and constituent elements. Terms such as "include" and/or "contain" may be construed as representing features, quantities, operations, constituent elements, components, or combinations thereof, but are not construed as excluding the existence or addition possibility of one or more other features, quantities, operations, constituent elements, components, or combinations thereof.

In addition, the expression "and/or" includes any and all combinations of associated listed words. For example, the expression "A and/or B" may include A, B, or both A and B.

Expressions including ordinal numbers such as "first" and "second" can modify elements. However, the elements are not limited by the expressions. For example, the expressions do not limit the order and/or importance of the elements. The expressions are only used to distinguish one element from another. For example, first user equipment and second user equipment indicate different user equipment, although both the first user equipment and the second user equipment are user equipment. Similarly, without departing from the scope of the embodiments, a first element may be referred to as a second element, and similarly, the second element may be referred to as the first element.

When a component is described as "being connected to" or "connecting to" another component, it should be understood that the component is not limited to being directly connected to or directly connecting to the another component, and there may be still another component between the component and the another component. In addition, when a component is described as "being directly connected to" or "directly connecting to" another component, it should be understood that there is no component between the components.

The foregoing descriptions are merely implementations, but are not intended to limit the scope of the embodiments. Any variation or replacement readily figured out by a person skilled in the art shall fall within the scope of the embodiments.

What is claimed is:

1. An energy storage system, comprising:
a cabinet;
an air conditioner, wherein the air conditioner is fastened to the cabinet and comprises an air supply vent and an air return vent;
a battery energy storage unit, wherein the battery energy storage unit is accommodated in the cabinet, a first channel and a second channel that are separated are formed between the battery energy storage unit and an inner wall of the cabinet, the second channel is connected to the air return vent, the battery energy storage unit comprises an air intake vent and an air exhaust vent, the air intake vent is connected to the first channel, and the air exhaust vent is connected to the second channel, a mounting component and at least two columns of battery modules mounted above the mounting component in a first direction, an air duct is fastened to the mounting component, the battery module comprises a first air intake surface and an air exhaust surface that are disposed opposite to each other in a second direction, the air exhaust surface is located on a side that is of the battery module and that faces the second channel, the air intake vent is disposed on the first air intake surface, the air exhaust vent is disposed on the air exhaust surface, and the first direction is different from the second direction; and wherein the air duct is accommodated in the second channel, connects the air supply vent and the first channel, and is configured to guide, to the first channel, an air flow blown out from the air supply vent.

2. The energy storage system according to claim 1, wherein the mounting component further comprises:
a plurality of mounting racks; and
an air guide plate, the plurality of mounting racks are arranged in the first direction, one column of support positions is formed between every two adjacent mounting racks, and each battery module is disposed on one support position; the air guide plate is fastened on a side that is of the mounting rack and that faces the air conditioner, and is in sealed contact with the inner wall of the cabinet, a side that is of the battery energy storage unit and that faces the air conditioner and the inner wall of the cabinet form the second channel, and a remaining part of the battery energy storage unit and the inner wall of the cabinet form the first channel; and the air guide plate comprises a connection port, the air duct is fastened to the air guide plate, and the air duct is connected to the first channel by using the connection port.

3. The energy storage system according to claim 2, wherein the air guide plate further comprises:
a first air guide plate, wherein the first air guide plate is fastened on a side that is of a mounting rack at the end in the first direction and that faces the air conditioner, and is in sealed contact with the inner wall of the cabinet, and the first air guide plate extends in a third direction; the connection port is disposed on the first air guide plate, and the air duct is fastened to the first air guide plate; and
a second air guide plate, wherein the second air guide plate is fastened on a side that is of the mounting rack and that faces the air conditioner, and is in sealed contact with the inner wall of the cabinet, the second air guide plate extends in the second direction, the third direction is different from the first direction, and the third direction is different from the second direction.

4. The energy storage system according to claim 3, wherein a gap is formed between every two adjacent battery modules in a same column of battery modules, the air guide plate further comprises a plurality of third air guide plates extending in the second direction, and each third air guide plate is fastened to sides that are of two adjacent mounting racks and that face the air conditioner to cover a corresponding gap formed between every two adjacent battery modules in the same column of battery modules.

5. The energy storage system according to claim 2, wherein the mounting rack further comprises:
a support; and
at least one guide rail fastened to the support, each battery module is slidably connected to a corresponding guide rail in the second direction, and a guide rail is sandwiched between every two adjacent battery modules in the third direction, so that a gap is formed between every two adjacent battery modules in the third direction, and the air guide plate is fastened to the support and/or the guide rail.

6. The energy storage system according to claim 5, wherein the air guide plate further comprises:
a fourth air guide plate fastened to and covering a support of the mounting rack at the end in the first direction, and the fourth air guide plate and the inner wall of the cabinet form a part of the first channel.

7. The energy storage system according to claim 5, wherein the support further comprises:
a first support post; and
a second support post that are spaced apart in the second direction, the at least one guide rail is fastened between the first support post and the second support post, the first support post is disposed on a side that is of the support and that is close to the air conditioner, the second support post is fastened to the cabinet, and the second support post and the first air intake surface are spaced apart.

8. The energy storage system according to claim 5, wherein the battery module further comprises:
a second air intake surface; and
a third air intake surface, the second air intake surface and the third air intake surface are disposed opposite to each other in the first direction, and air intake vents are disposed on both the second air intake surface and the third air intake surface; and in every two adjacent battery modules in the first direction, a second air intake surface of one battery module and a third air intake surface of the other battery module are disposed opposite to each other and a gap is formed.

9. The energy storage system according to claim 5, wherein the battery module further comprises:
a fourth air intake surface; and
a fifth air intake surface, the fourth air intake surface and the fifth air intake surface are disposed opposite to each other in the third direction, air intake vents are disposed on both the fourth air intake surface and the fifth air intake surface, the third direction is different from the first direction, and the third direction is different from the second direction; and in every two adjacent battery modules in the third direction, a fourth air intake surface of one battery module and a fifth air intake surface of the other battery module are disposed opposite to each other and a gap is formed.

10. The energy storage system according to claim 5, wherein the battery module further comprises:
a mounting ear disposed on the air exhaust surface, and the mounting ear is fastened to a corresponding mounting rack.

11. The energy storage system according to claim 1, wherein the cabinet further comprises:
a body; and
two cabinet doors rotatably connected to the body and arranged in the first direction, wherein at least one column of air conditioners in a third direction is disposed on each cabinet door, each column of air conditioners corresponds to at least one column of battery modules, an inner wall of the body and the mounting component form the first channel, an inner wall of the cabinet door and the battery energy storage unit form the second channel, the third direction is different from the first direction, and the third direction is different from the second direction.

12. The energy storage system according to claim 11, wherein the body further comprises:
two side panels;
a rear panel;
a top panel; and
a bottom panel, each side panel is correspondingly rotatably connected to one cabinet door, the rear panel is fastened to the two side panels, the rear panel and the cabinet door are disposed opposite to each other in the second direction, the top panel is fastened to the two side panels, and the bottom panel is fastened to the two side panels, all of the side panel, the rear panel, the top panel, and the bottom panel are all in sealed contact with the battery energy storage unit, and the side panel, the rear panel, the top panel, the bottom panel, and the battery energy storage unit jointly form the first channel.

13. The energy storage system according to claim 1, wherein there are at least two air conditioners arranged in two columns in the first direction, and each column of air conditioners corresponds to at least one column of battery modules; and the battery module comprises a housing, a battery body, and a module fan, the battery body and the module fan are fastened and accommodated in the housing, and when an abnormal air conditioner column exists in the two columns of air conditioners, a rotational speed of a module fan of a battery module corresponding to the abnormal air conditioner column increases.

14. The energy storage system according to claim 1, wherein the energy storage system further comprises:
    a drainage fan fastened and accommodated in the first channel.

15. The energy storage system according to claim 14, wherein there are at least two air conditioners, the at least two air conditioners are arranged into a first air conditioner column and a second air conditioner column in the first direction, and each of the first air conditioner column and the second air conditioner column corresponds to at least one column of the battery module; and the drainage fan is a reversible blow fan, and an air exhaust surface of the drainage fan faces a side on which a battery module corresponding to an abnormal air conditioner column in the first air conditioner column and the second air conditioner column is located.

16. The energy storage system according to claim 15, wherein the battery energy storage unit further comprises:
    a backflow prevention member located between the inner wall of the cabinet and a side that is of the battery energy storage unit and that is away from the air conditioner, and the drainage fan is mounted above the backflow prevention member.

17. The energy storage system according to claim 1, wherein the battery energy storage unit further comprises:
    a power distribution component mounted to the mounting component.

18. The energy storage system according to claim 1, wherein the energy storage system further comprises:
    a direct current converter fastened on an outer side surface of the cabinet and configured to convert a voltage of the battery module.

19. The energy storage system according to claim 1, wherein the air duct further comprises:
    a first air duct, wherein the first air duct is fastened to the air conditioner and the air supply vent is connected to the first air duct; and
    a second air duct, wherein one end of the second air duct and the first air duct are in a bent connection to and communicate with each other, and an end that is of the second air duct and that is away from the first air duct is fastened to the battery energy storage unit, and the second air duct is connected to the first air duct and the first channel.

* * * * *